US006628139B2

(12) United States Patent
Porter et al.

(10) Patent No.: US 6,628,139 B2
(45) Date of Patent: Sep. 30, 2003

(54) DIGITAL LOGIC DEVICES WITH EXTREMELY SKEWED TRIP POINTS AND RESET CIRCUITRY FOR RAPIDLY PROPAGATING SIGNAL EDGES

(75) Inventors: John D. Porter, Boise, ID (US); Dean D. Gans, Boise, ID (US); Larren G. Weber, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/922,027

(22) Filed: Aug. 3, 2001

(65) Prior Publication Data

US 2003/0025527 A1 Feb. 6, 2003

(51) Int. Cl.[7] .......................................... H03K 19/0175
(52) U.S. Cl. ............................... 326/26; 326/27; 326/82
(58) Field of Search ............................... 326/17, 82, 26, 326/27, 93, 95

(56) References Cited

U.S. PATENT DOCUMENTS

| | | | |
|---|---|---|---|
| 4,948,990 A | | 8/1990 | Shin et al. |
| 5,343,090 A | | 8/1994 | Proebsting |
| 5,410,189 A | * | 4/1995 | Nguyen ....................... 327/374 |
| 5,467,037 A | | 11/1995 | Kumar et al. |
| 5,864,251 A | | 1/1999 | Bloker et al. |
| 5,942,917 A | | 8/1999 | Chappell et al. |
| 5,982,198 A | | 11/1999 | Fulkerson |
| 6,011,410 A | * | 1/2000 | Kim et al. ..................... 326/98 |
| 6,040,713 A | | 3/2000 | Porter et al. |
| 6,307,409 B1 | * | 10/2001 | Wrathall ....................... 327/112 |

OTHER PUBLICATIONS

Braceras, G., et al., "A 350 MHz 3.3V 4Mb SRAM Fabricated in a 0.3 μm CMOS Process," ISSCC97/Session 24/Non–Volatile Memory and SRAM/Paper SP 24.5, IEEE Internat'l. Solid–State Circuits Conf., Digest of Technical Papers, Feb. 1997, pp. 404–405.

Amrutur, B., et al., "A Replica Technique for Wordline and Sense Control in Low–Power SRAM's," IEEE Journal of Solid–State Circuits, vol. 33, No. 8, Aug. 1998, pp. 1208–1219.

* cited by examiner

Primary Examiner—Michael Tokar
Assistant Examiner—Anh Tran
(74) Attorney, Agent, or Firm—TraskBritt

(57) ABSTRACT

The invention includes digital logic devices with extremely skewed trip points and reset circuitry for rapidly propagating signal edges. Embodiments of skewed logic devices in accordance with the present invention included inverters, buffers, NOR gates, NAND gates for rapidly propagating a selected "fast" edge of an input signal. Additional embodiments include pulse stretchers, memory devices, substrates, computer systems and methods incorporating the skewed logic devices of the present invention. Each embodiment of a skewed logic device of the present invention is configured to propagate a either a fast rising edge or fast falling edge of an output signal, i.e., the "fast" edge, at rates comparable to those of domino logic. An advantage of the skewed logic devices of the present invention over conventional CMOS logic devices is rapid edge propagation. Additionally, virtually all of the input gate loading is devoted to the fast edge being propagated. Additionally, the reset networks, as disclosed herein, are buffered by at least two gates, thus reducing loading seen by the input or the output of the skewed logic device.

10 Claims, 23 Drawing Sheets

DIGITAL LOGIC DEVICES WITH EXTREMELY SKEWED TRIP POINTS AND RESET CIRCUITRY FOR RAPIDLY PROPAGATING SIGNAL EDGES

FIELD OF THE INVENTION

The present invention relates to digital logic devices used in integrated circuits. More specifically, the present invention relates to digital logic gates, such as inverters, buffers, NAND gates and NOR gates, with extremely skewed trip points and reset circuitry for propagating fast signal edges. Additionally, the present invention relates to circuits, substrates, systems and methods incorporating digital logic gates with extremely skewed trip points.

BACKGROUND OF THE INVENTION

Advances in semiconductor manufacturing technologies have allowed digital integrated circuit designers to place several million transistors interconnected on a single substrate. Concurrently, advances in computer architecture and particularly processor architecture have driven ever-shorter cycle times. These advances in semiconductor manufacturing and processor architecture have forced digital integrated circuit designers to consider new ways of implementing basic circuit functions, particularly for low-power and high-speed applications.

In metal oxide semiconductor (MOS) devices, the speed of operation is limited by the resistance of a given MOS transistor driving the capacitance (input load) of the next MOS transistor. The output current of a MOS transistor is proportional to its channel width. Thus, if a narrow channel transistor is used to drive a high capacitance load, a relatively long delay results. To reduce this delay in digital circuits, a series of cascaded inverters is frequently used. For example, see U.S. Pat. No. 5,343,090, explicitly incorporated herein by reference for all purposes.

Increasing clock frequency is another approach to reducing cycle times. However, by increasing clock frequencies, fewer (or shorter) logic gate delays are permitted during each clock cycle. To accommodate this need for shorter gate delays, a number of circuit technologies have been implemented for high-speed operation.

Static full complementary metal-oxide semiconductor (CMOS) logic provides two types of transistors, a p-type transistor (PMOS) and an n-type transistor (NMOS). The terms "device" and "structure" used herein to describe CMOS logic include PMOS and NMOS transistors. FIG. 1 illustrates a conventional inverter 100 constructed from CMOS logic. FIG. 2 is a timing diagram for conventional inverter 100 illustrating input signal IN and output signal OUT. Additionally, input gate loading is shared between devices that generate rising and falling edges of a conventional CMOS inverter.

Dynamic logic structures, e.g., domino logic devices, propagate signal edges much quicker than static full CMOS logic. Domino logic refers to a circuit arrangement in which there are several series-coupled logic stages having precharged output nodes. The output node of an individual logic stage is precharged to a first logic level. Logic signals are then applied such that, depending on the logic function being implemented and the state of the various input signals, the output node can be switched to a second logic level. As each domino stage in the chain evaluates, the output of the next domino stage may be enabled to switch. However, problems with domino logic include the necessity for precharge circuitry and charge sharing induced noise.

There is a need in the art for digital logic devices capable of propagating selected signal edges more rapidly than conventional CMOS inverters, with virtually all of the input gate loading (capacitance) devoted to the devices that generate a fast edge being propagated, and without the charge sharing induced noise problem associated with domino logic.

SUMMARY OF THE INVENTION

The invention includes digital logic devices with extremely skewed trip points and reset circuitry, referred to herein as "skewed logic devices," for rapidly propagating signal edges. Embodiments of skewed logic devices according to the present invention include inverters, buffers, NAND gates and NOR gates. The invention also includes circuits, substrates, systems and methods including skewed logic devices as disclosed herein. Each embodiment of a skewed logic device of the present invention is configured to rapidly propagate either a rising edge or falling edge of an output signal, i.e., the "fast" edge, with a delay comparable to that of domino logic. The other corresponding, "slow" edge propagates with a delay of about 2 to 4 ordinary gate delays.

An advantage of the skewed logic devices of the present invention over conventional CMOS inverters is rapid edge propagation. Another advantage is that virtually all of the input gate loading is devoted to the fast edge being propagated. Additionally, the reset networks described herein are buffered by at least 2 gates, thus reducing loading seen by the input or the output of the skewed logic device associated with conventional reset circuitry.

An embodiment of a skewed inverter rising logic device of the present invention for rapidly propagating a rising edge of an output signal includes a fast inverter rising having a large p/n channel width ratio for receiving an input signal and rapidly propagating a rising edge onto the output signal in response to receiving a falling edge on the input signal. A skewed inverter rising logic device further includes a pull-down reset network connected in parallel with the fast inverter rising for resetting the output signal after the rising edge has been propagated onto the output signal, and a feedback delay circuit connected in parallel with the pull-down reset network for delaying and returning the output signal back to the pull-down reset network.

An embodiment of a skewed inverter falling logic device of the present invention for rapidly propagating a falling edge output signal includes a fast inverter falling having a large n/p channel width ratio for receiving an input signal and rapidly propagating a falling edge onto the output signal in response to receiving a rising edge on the input signal. Skewed inverter falling logic device further includes a pull-up reset network connected in parallel to the fast inverter falling for resetting the output signal after the falling edge has been propagated onto the output signal, and a feedback delay circuit connected in parallel with the pull-up reset network for delaying and returning the output signal to the pull-up reset network.

An embodiment of a skewed buffer rising logic device of the present invention for rapidly propagating a rising edge of an output signal includes a fast inverter falling having a large n/p channel width ratio for receiving a rising edge of an input signal and rapidly propagating a falling edge of an intermediate signal in response thereto and a fast inverter rising having a large p/n channel width ratio and in series with the fast inverter falling for receiving the rapidly propagated falling edge of the intermediate signal and rapidly propagated rising edge on the output signal. A skewed buffer rising logic device may further include a reset network coupled to the fast inverter falling and the fast inverter rising for resetting output signals of the fast inverter falling and the fast inverter rising after the rising edge of the output signal has been rapidly propagated, and a feedback delay circuit operably coupled between an output of the fast inverter rising and an input of the reset network for propagating the output signal to the reset network.

An embodiment of a skewed buffer falling logic device of the present invention for rapidly propagating a falling edge of an output signal includes a fast inverter rising having a large p/n channel width ratio for receiving a falling edge of an input signal and rapidly propagating a rising edge of an intermediate signal in response thereto and a fast inverter falling having a large n/p channel width ratio and in series with the fast inverter rising for receiving the rapidly propagated rising edge of the intermediate signal and rapidly propagated falling edge on the output signal. A skewed buffer falling logic device may further include a reset network coupled to the fast inverter rising and the fast inverter falling for resetting output signals of the fast inverter rising and the fast inverter falling after the falling edge of an output signal has been rapidly propagated, and a feedback delay circuit operably coupled between an output of the fast inverter falling and an input of the reset network for propagating the output signal to the reset network.

An embodiment of a skewed NOR falling logic device of the present invention for rapidly propagating a falling edge of an output signal includes a fast NOR gate falling having a large n/p channel width ratio for receiving a first input signal and a second input signal and rapidly propagating a falling edge of the output signal in response to a rising edge on either of the first input signal or the second input signal. A skewed NOR falling logic device may further include a pull-up reset network connected in parallel with the fast NOR gate falling for resetting the output signal, and a feedback delay circuit connected in parallel with the pull-up reset network for propagating the output signal to an input of the pull-up reset network.

An embodiment of a skewed NOR rising logic device of the present invention for rapidly propagating a rising edge of an output signal includes a fast NOR gate rising having a large p/n channel width ratio for receiving a first input signal and a second input signal and rapidly propagating a rising edge of the output signal in response to a falling edge on both of the first input signal and the second input signal. A skewed NOR rising logic device may further include a pull-down reset network connected in parallel with the fast NOR gate rising for resetting the output signal after the rising edge of the output signal has been propagated, and a feedback delay circuit connected in parallel with the pull-down reset network for delaying and returning the output signal back to an input of the pull-down reset network.

An embodiment of a skewed NAND falling logic device of the present invention for rapidly propagating a falling edge of an output signal includes a fast NAND gate falling having a large n/p channel width ratio for receiving both a first input signal and a second input signal and rapidly propagating a falling edge of the output signal in response to rising edges on both the first input signal and the second input signal. A skewed NAND falling logic device may further include a pull-up reset network connected in parallel with the fast NAND gate falling for resetting the output signal after the falling edge of the output signal has been propagated, and a feedback delay circuit connected in parallel with the pull-up reset network for delaying and returning the output signal to an input of the pull-up reset network.

An embodiment of a skewed NAND rising logic device of the present invention for rapidly propagating a rising edge of an output signal includes a fast NAND gate rising having a large p/n channel width ratio for receiving both a first input signal and a second input signal and rapidly propagating a rising edge of the output signal in response to falling edges on either the first input signal or the second input signal. A skewed NAND rising logic device may further include a pull-down reset network connected in parallel with the fast NAND gate rising for resetting the output signal after the rising edge of the output signal has been propagated, and a feedback delay circuit connected in parallel with the pull-down reset network for delaying and returning the output signal to an input of the pull-down reset network.

A method for rapidly propagating a fast edge of an output signal through a skewed logic device of the present invention is disclosed. Additionally, integrated circuits, substrates, computer systems, pulse stretchers and cascaded combinations of skewed logic devices of the present invention are also disclosed.

BRIEF DESCRIPTION OF THE DRAWINGS

In the drawings, which illustrate what is currently regarded as the best mode for carrying out the invention and in which like reference numerals refer to like parts in different views or embodiments.

DETAILED DESCRIPTION OF THE INVENTION

The invention includes digital logic devices with extremely skewed trip points and reset circuitry for rapidly propagating signal edges, hereinafter "skewed logic devices." Embodiments of skewed logic devices in accordance with the present invention include inverters, buffers, NOR gates and NAND gates for rapidly propagating a selected "fast" edge of an input signal. Additional embodiments disclosed herein include pulse stretchers, memory devices, substrates, computer systems and methods incorporating the skewed logic devices of the present invention.

The term "high" is used herein to indicate the state of an electrical signal at a logical true or high voltage condition, for example, supply voltage or 2.5 volts. The invention is not dependent on the particular supply voltage which may, for example and not by way of limitation, range from about 5.0 volts to about 1.5 volts depending on the device technology used. The term "low" is used herein to indicate the state of an electrical signal at a logical false or low voltage condition, for example, ground potential or zero (0) volts. Additionally, the invention is not dependent on the magnitude of the full voltage swing from ground potential to supply voltage, i.e., rail-to-rail voltage. The terms "signal" and "node" may be used synonymously herein to indicate an electrically conductive circuit trace that may connect an electrical device input or output to one or more other device inputs or outputs, or supply or ground potential voltages.

Figure 1:
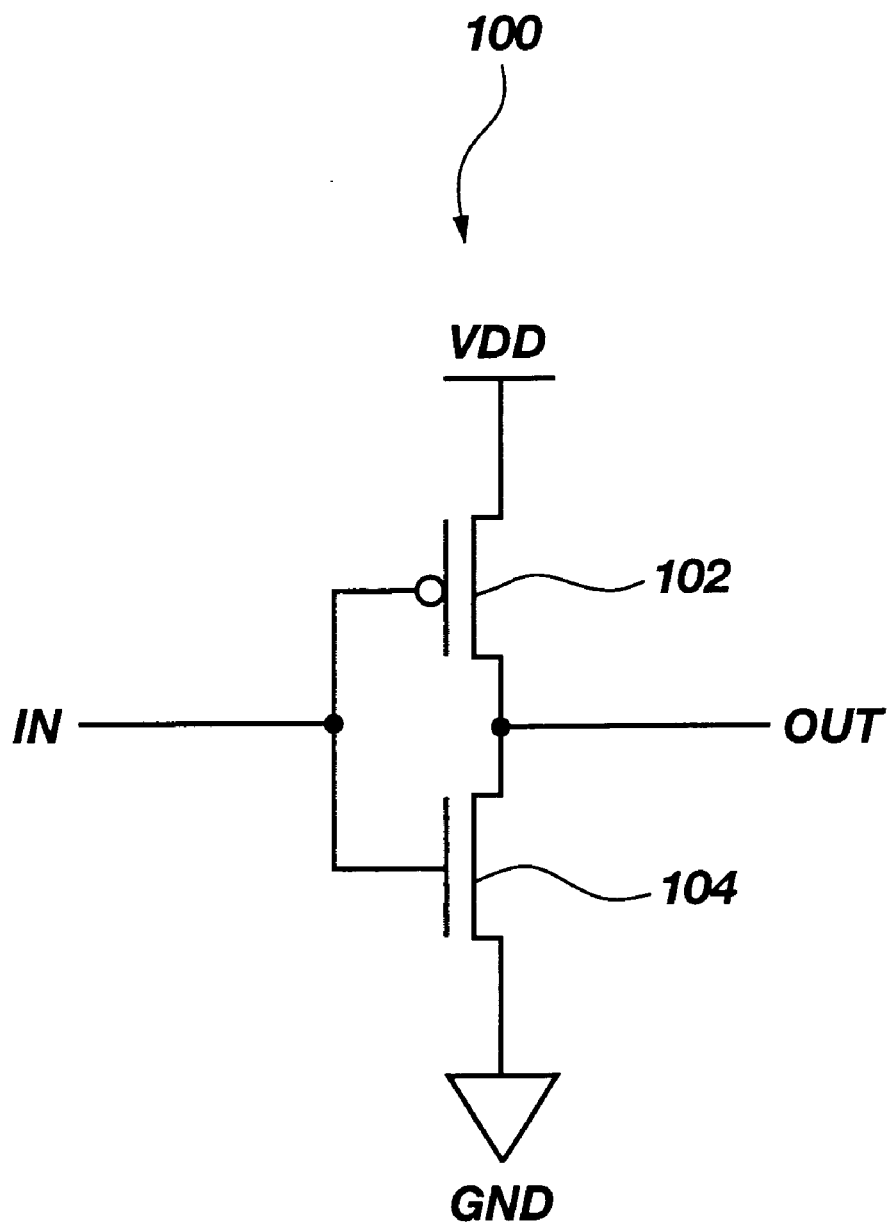
FIG. 1 is a circuit diagram of a conventional static CMOS inverter.
Figure 2:
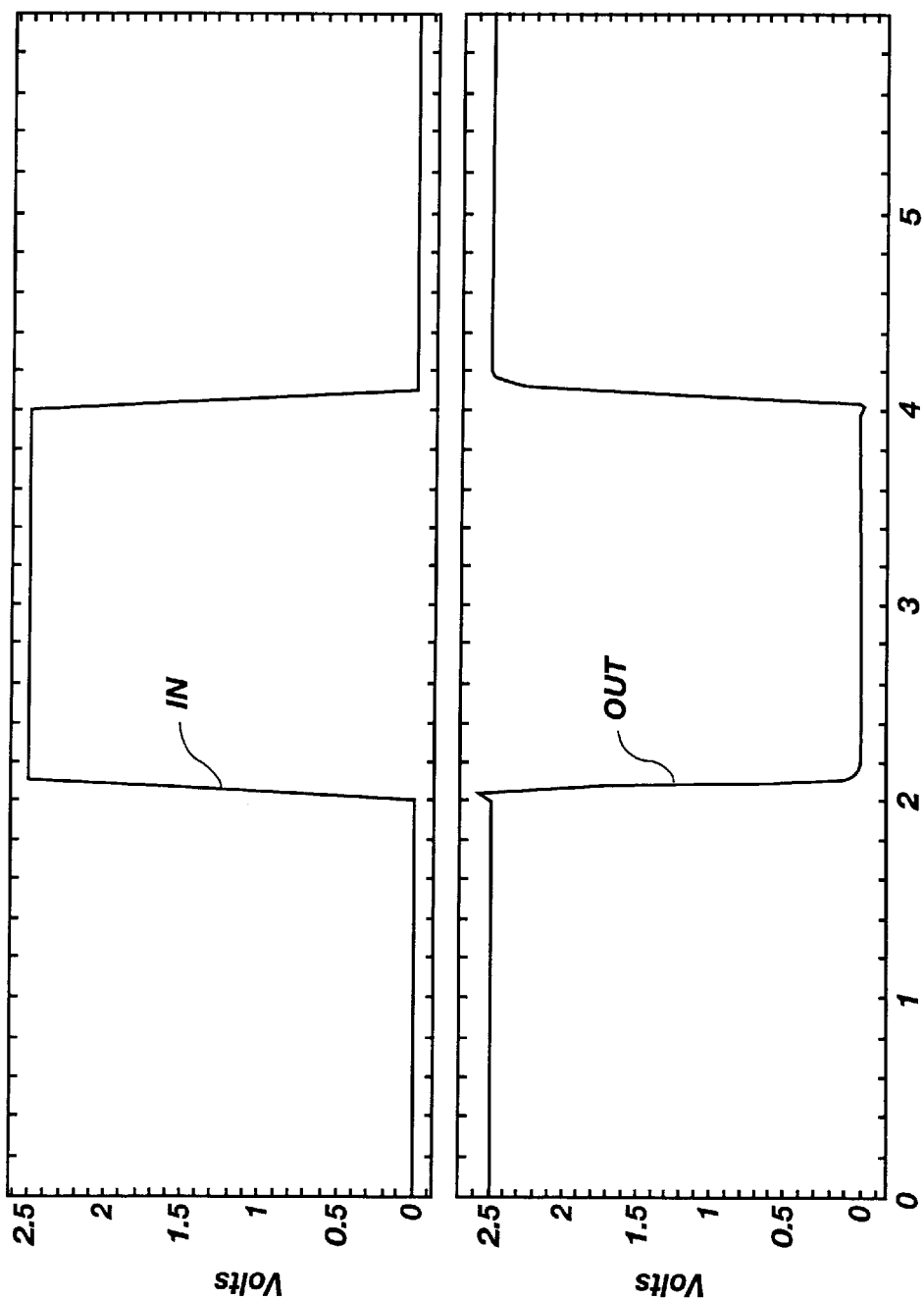
FIG. 2 is a timing diagram for the conventional inverter of FIG. 1 illustrating relative timing for input signal and output signals.
Figure 3:
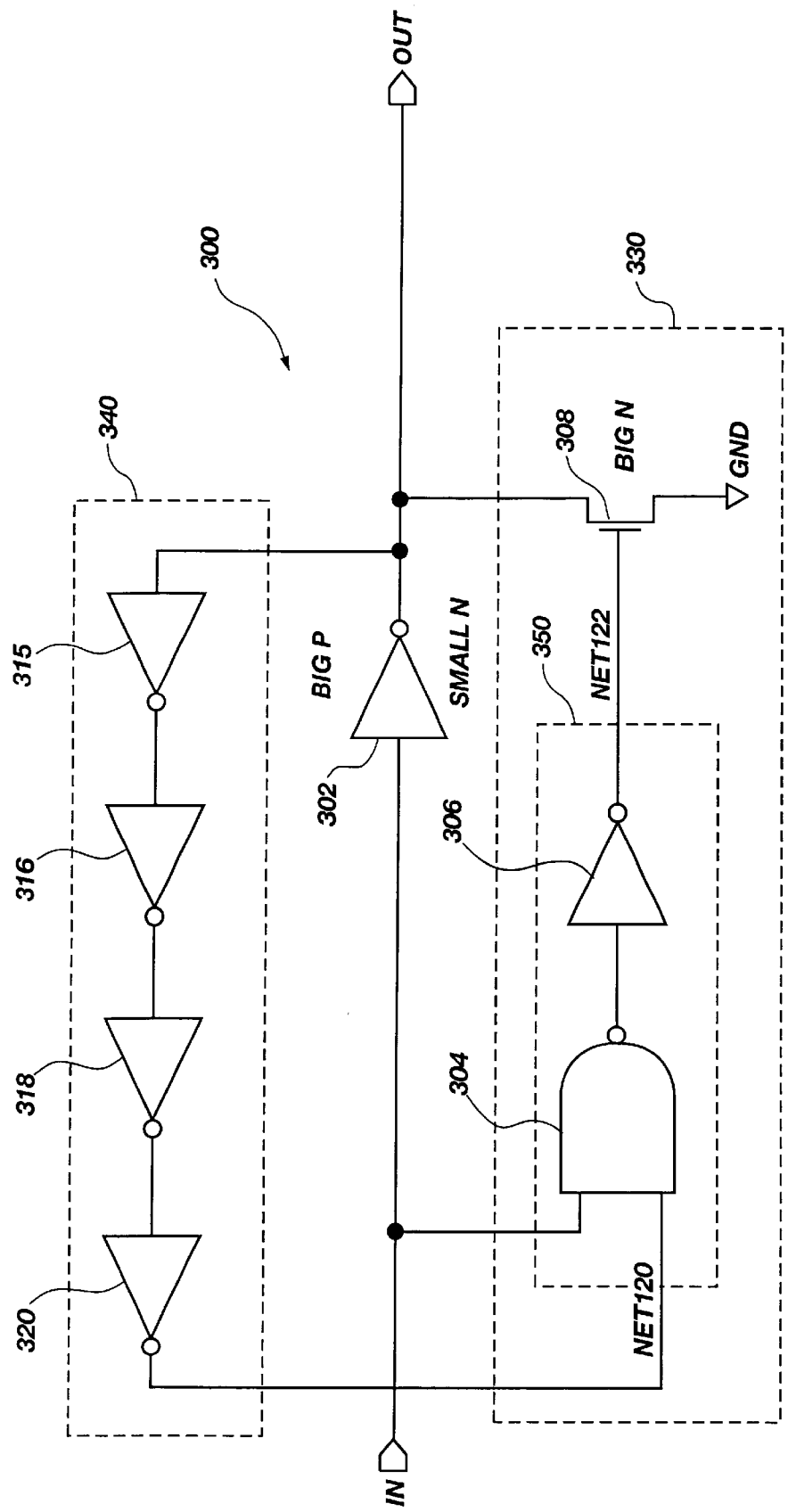
FIG. 3 is a schematic diagram of an embodiment of a skewed inverter rising logic device with a fast rising edge in accordance with the present invention.

FIG. 3 is a schematic diagram of a skewed inverter rising logic device 300 for rapidly propagating a rising edge of an output signal OUT in accordance with the present invention. Skewed inverter rising logic device 300 includes fast inverter 302, pull-down reset network 330 and feedback delay circuit 340. External signals of the skewed inverter rising logic device 300 include input signal IN and output signal OUT. Input signal IN is input to fast inverter 302. Fast inverter 302 directly drives output signal OUT.

As known to one of ordinary skill in the art, channel width is directly proportional to the gain of a MOS transistor. One of ordinary skill in the art will also recognize that a plurality of MOS transistors may be placed in parallel with gates, drains and sources coupled together to effectively increase the gain of a single MOS transistor. Thus, the exemplary transistors illustrated herein may be modified in such ways known to one of ordinary skill in the art and still be within the scope of the present invention. Fast inverter 302 is configured with a relatively wide p-channel (denoted "BIG P") and a relatively narrow n-channel (denoted "SMALL N") and thus, will rapidly propagate the rising edge of an output signal OUT. Because the p-channel is significantly wider than the n-channel, the rising edge of an output signal OUT will propagate more rapidly than a rising edge propagating through a conventional CMOS inverter with similarly sized p-channel and n-channel widths. An embodiment of fast inverter 302 may include a PMOS transistor (not shown) with a relatively wide p-channel and a complementary NMOS transistor (also not shown) with a relatively narrow n-channel.

By "skewing" the width of a particular channel relative to the other channel, the trip-point of a transistor may also be "skewed," resulting in a selected "fast" edge of an output signal OUT propagating more rapidly than the other "slow" edge. Thus, the relative widths of the n-channel and p-channel which form the skewed logic devices of the present invention may be significantly uneven, relative to conventional CMOS logic devices. The terms "relatively wide" or "large" as associated with a channel width ratio herein are used synonymously and may be measured by a p/n channel width ratio or conversely an n/p channel width ratio of the devices (MOS transistors) that are used to form the "fast" gates of the skewed logic devices.

Similarly, the terms "BIG," "wide" and "relatively wide" in reference to channel widths of a given transistor (NMOS or PMOS) are used synonymously herein and are relative to a conventional channel width for the same transistor for a given manufacturing process. The ratio of the "BIG" transistor channel width over the conventional channel width forms a "channel width ratio" useful for describing a "BIG" transistor. For example, and not by way of limitation, if a PMOS transistor may be conventionally formed with a 10 µm p-channel in accordance with a given manufacturing process and a "BIG" PMOS transistor has a p-channel of 2000 µm in width, the "channel width ratio" will be 200. Thus, a "BIG" transistor has a channel width ratio greater than 1.0 relative to a conventional channel width for the same transistor. Another measure which may be useful for describing a "BIG" transistor is a channel width greater than 10 µm. However, as manufacturing processes continually reduce the scale of feature dimensions, the standard channel width for NMOS and PMOS transistors will likely reduce in size as well. So, the term "BIG" associated with channel width and as used herein is preferably measured relative to a conventional or smallest channel width for a given manufacturing process.

The rapid edge propagation of the skewed logic devices of the present invention is a gradual effect beginning with a p/n channel width ratio, or conversely an n/p channel width ratio, of greater than 1.0 and having an upper range only limited by space for the physical layout of the device. Preferably, the p/n, or n/p, channel width ratio should be in the range from about 5 to about 200. Thus, a "relatively wide" n/p channel width ratio, or p/n channel width ratio, is preferably in the range from about 5 to about 200. Larger ratios are also possible but may be less preferable depending on the particular physical layout and space limitations of the semiconductor device manufacturing process used to form the skewed logic devices of the present invention.

A significant purpose of feedback delay circuit 340 is to indicate the state of the output signal OUT to pull-down reset network 330. The length of the delay of feedback delay circuit 340 must be greater than the sum of the slew rate of the output signal OUT and the RC delay of the line being driven by pull-down reset network 330. As shown in FIG. 3, feedback delay circuit 340 may include four inverters 315, 316, 318 and 320. Feedback delay circuit 340 delays and returns output signal OUT through a series of inverters 315, 316, 318 and 320 and ultimately outputs signal NET120 to an input of pull-down reset network 330. More specifically, output signal OUT is input to inverter 315. The output of inverter 315 is input to inverter 316. The output of inverter 316 is input to inverter 318. The output of inverter 318 is input to inverter 320. The output of inverter 320 is NET120. Of course, many other logically equivalent structures with a suitable delay that ensures the output is fully reset may be substituted for the four inverters 315, 316, 318, 320, as shown in the feedback delay circuit 340 of FIG. 3. For example, and not by way of limitation, four buffers connected in series, or four delay elements connected in series, may be substituted for the four inverters 315, 316, 318, 320. Such other logically equivalent structures will be within the knowledge of one of ordinary skill in the art and are also contemplated as being within the scope of the present invention.

Pull-down reset network 330 includes combinational logic 350 and big NMOS transistor 308. Combinational logic 350 may include NAND gate 304 and inverter 306, as shown in FIG. 3. Alternatively, combinational logic 350 may include other suitable combinations of logic gates, see FIGS. 7A and 7B and related discussion below. Pull-down reset network 330 has two inputs and one output. The inputs of pull-down reset network 330 correspond to first and second inputs of NAND gate 304. The first input of NAND gate 304 is input signal IN and the second input signal of NAND gate 304 is NET120. The output of NAND gate 304 is input to inverter 306. The signal NET122 of inverter 306 drives a gate node of big NMOS transistor 308. A drain node of big NMOS transistor 308 is connected to output signal OUT and a source node is coupled to ground potential GND. Big NMOS transistor 308 has a relatively wide n-channel (denoted "BIG N" in FIG. 3) and thus, is configured for rapidly switching the output signal OUT in response to a high voltage. A relatively wide channel, or "BIG" channel width, whether n-type or p-type, may be in the range of approximately 10 $\mu$m to approximately 10 mm in width.

Figure 4:
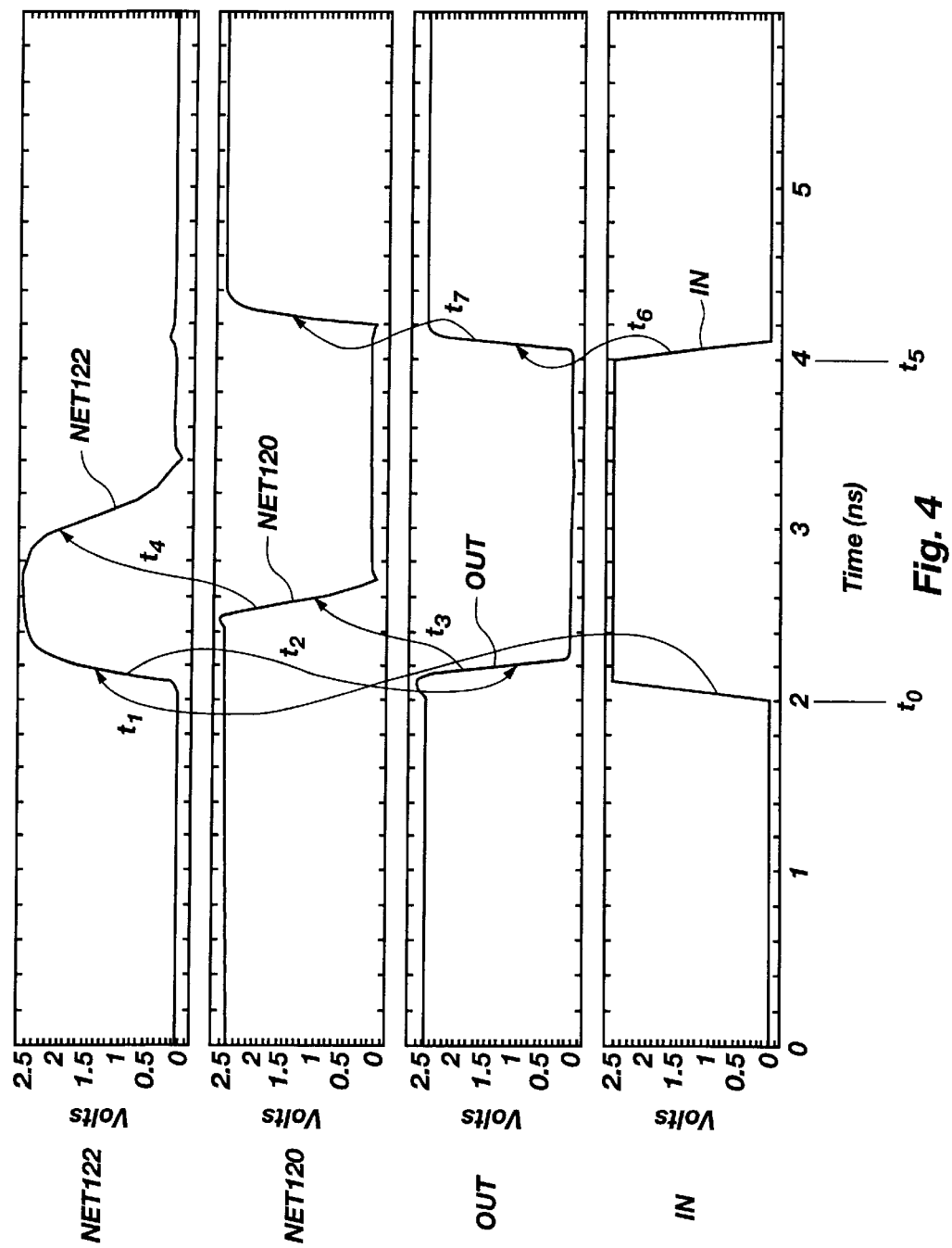
FIG. 4 is a timing diagram of the embodiment of a skewed inverter rising logic device shown in FIG. 3.

The operation of the skewed inverter rising logic device 300 shown in FIG. 3 is described with reference to the timing diagram of FIG. 4. FIG. 4 is a timing diagram of signals IN, OUT, NET120 and NET122 as shown in the skewed inverter rising logic device 300 of FIG. 3. Just prior to time $t_0$, input signal IN is low, output signal OUT is high, node NET 120 is high and node NET 122 is low. Beginning at time $t_0$, input signal IN transitions high, driving the output signal OUT low. The small NMOS transistor (n-channel) of fast inverter 302 attempts to pull output signal OUT low; however, pull-down reset network 330 actually drives the output signal OUT low with little help from the small n-channel of the NMOS transistor of fast inverter 302, as explained in further detail below.

The transition of input signal IN from low to high is propagated through pull-down reset network 330 during time period $t_1$. More specifically, as input signal IN transitions high, both inputs, IN and NET 120, to NAND gate 304 are high, which changes the output of NAND gate 304 to low. The low output from NAND gate 304 is input to inverter 306, which, in turn, changes signal NET 122 to a high, driving the gate of big NMOS transistor 308. Because big NMOS transistor 308 has a "big" n-channel, the output signal OUT is then rapidly pulled low during time period $t_2$. The small n-channel of fast inverter 302 reinforces the low voltage on output signal OUT.

The transition of output signal OUT from high to low propagates through feedback delay circuit 340 during time period $t_3$. When output signal OUT goes low, inverter 315 outputs a high. The high output of inverter 315 is input to inverter 316, driving the output of inverter 316 low, which in turn drives the output of inverter 318 high, and then drives the output NET120 of inverter 320 low as shown in FIG. 4.

The transition of NET120 low propagates through pull-down reset network 330 during time period $t_4$, turning big NMOS transistor 308 off. More specifically, with NET120 low and input signal IN high, the output of NAND gate 304 goes high. The high input to inverter 306 drives NET122 low, which turns big NMOS transistor 308 off, leaving output signal OUT low. Again, the small NMOS transistor of fast inverter 302 actively, but weakly, holds the output signal OUT low.

At time $t_5$, input signal IN is high, output signal OUT is low, NET120 is low and NET122 is low. As input signal IN transitions low during time period $t_6$, output signal OUT rapidly transitions high through fast inverter 302. The transition of the output signal OUT to high drives node NET120 high during time period $t_7$. More specifically, a high on output signal OUT drives the output of inverter 315 low. The low input to inverter 316 drives the output of inverter 316 to high, which in turn drives the output of inverter 318 low, which in turn drives the output of inverter 320, or node NET120, high as shown in FIG. 4. After node NET120 transitions high during time period $t_7$, the skewed inverter rising logic device 300 is back to its initial state, as it was just prior to $t_0$.

Figure 5:
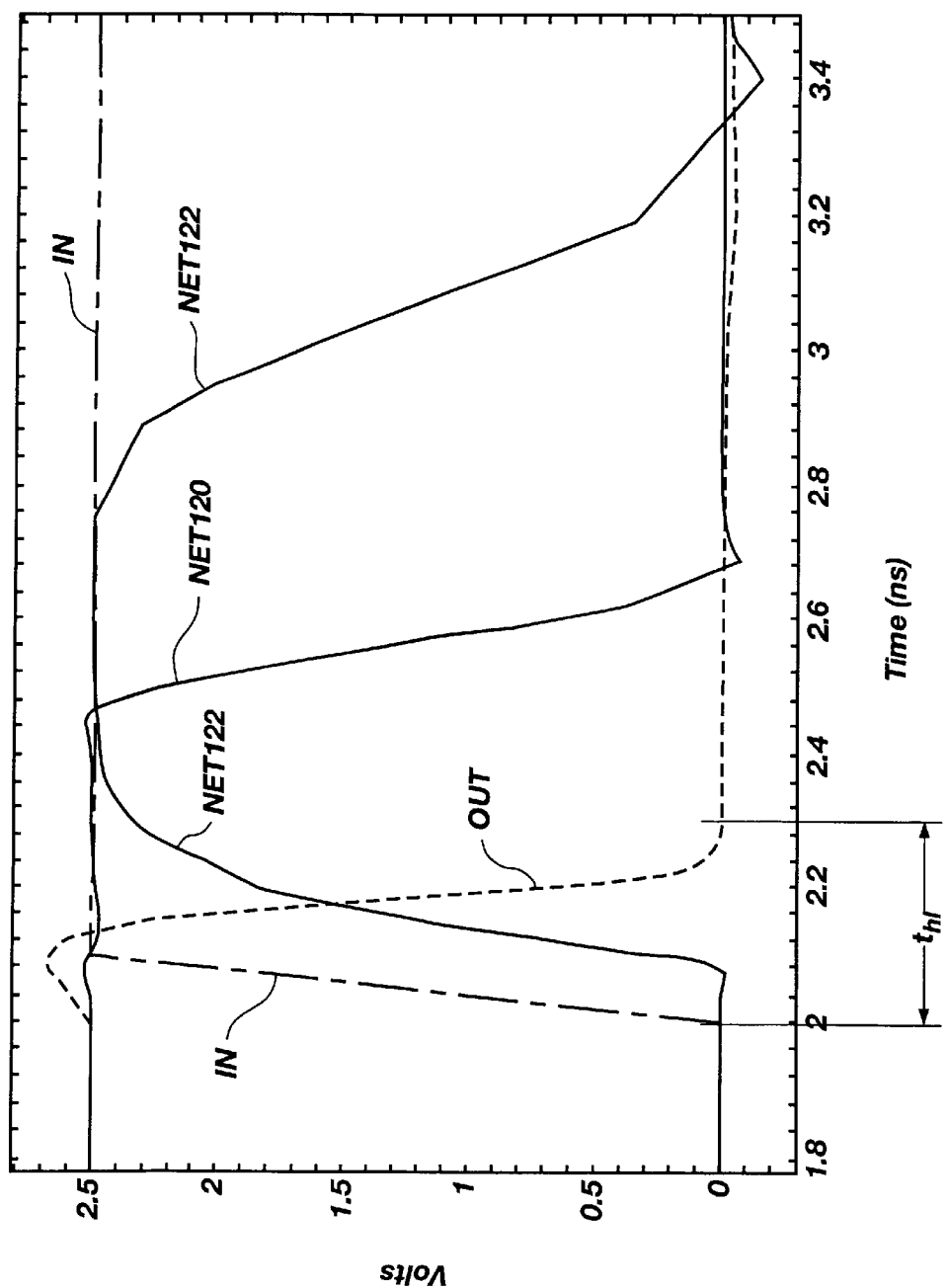
FIG. 5 is an expanded timing diagram corresponding to time $t_0$ through time $t_4$ as indicated in FIG. 4 with input, output and internal node signals superimposed.

FIG. 5 is an expanded timing diagram corresponding to time $t_0$ through time period $t_4$ as indicated in FIG. 4 with signals IN, OUT, NET120 and NET122 superimposed. FIG. 5 also illustrates the period of time for input signal IN to go high and output signal OUT to go low, $t_{hl}$.

Figure 6:
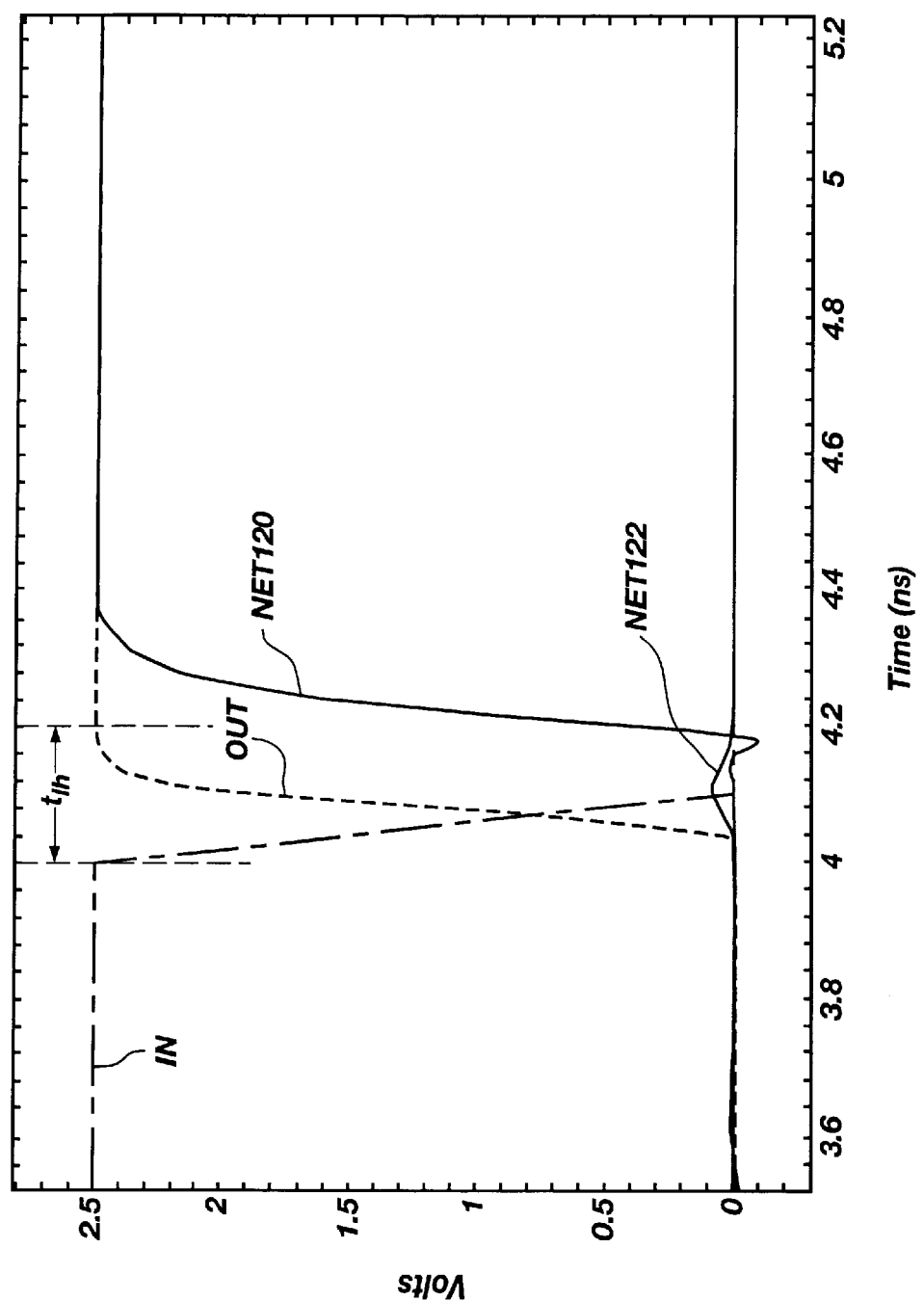
FIG. 6 is an expanded timing diagram corresponding to time $t_5$ through time $t_7$ as indicated in FIG. 4 with input, output and internal node signals superimposed.

FIG. 6 is an expanded timing diagram corresponding to time $t_5$ through time period t as indicated in FIG. 4 with signals IN, OUT, NET120 and NET122 superimposed. FIG. 6 also illustrates the period of time for input signal IN to go low and output signal OUT to go high, $t_{lh}$. The short duration of time period $t_{lh}$, during which output signal OUT transitions from low to high, is extremely fast and comparable to the speeds obtained with conventional domino logic.

As noted above, one of ordinary skill in the art will recognize that there are other combinations of logic gates that are equivalent in function and timing to combinational logic 350, i.e., that perform an AND function with approximately two gate delays and thus, may be substituted for same. For example, FIGS. 7A and 7B are logic diagrams of alternative combinational logic 350A and 350B that perform a logical AND function using two gates to reduce input and output loading and are suitable for use in a pull-down network of a skewed inverter rising logic device in accordance with the present invention.

Figure 7A:
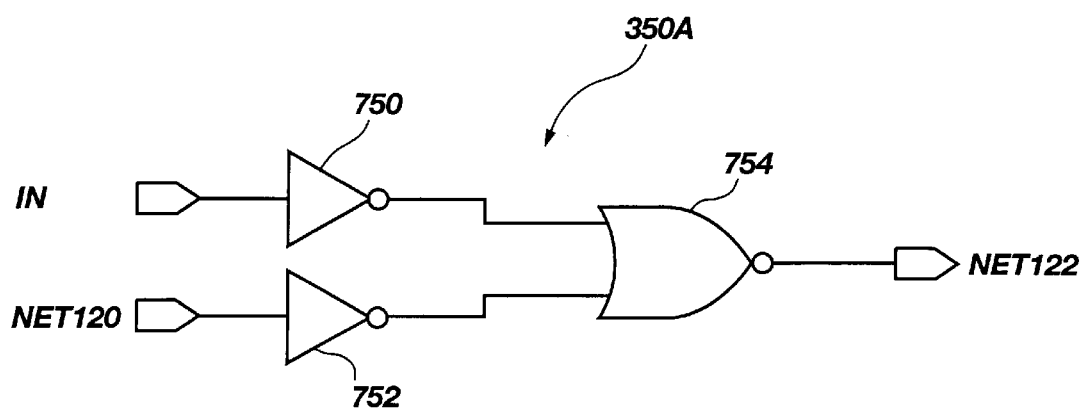
FIGS. 7A and 7B are logic diagrams of alternative combinational logic suitable for use in a pull-down network of a skewed inverter rising logic device in accordance with the invention.
Figure 7B:
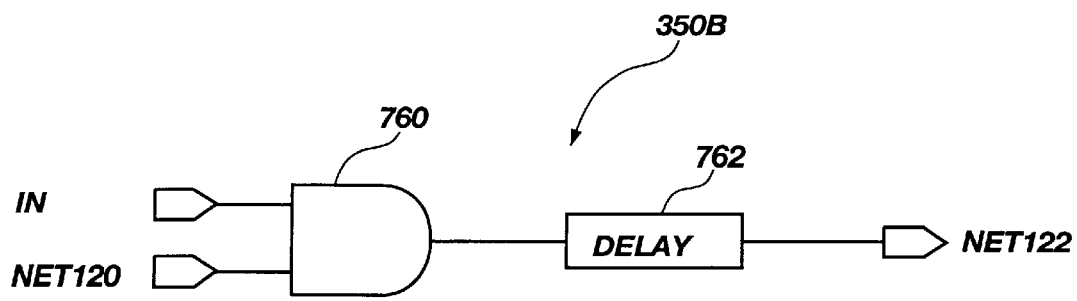

FIG. 7A is a logic diagram of alternative combinational logic 350A which may be used in place of combinational logic 350. Combinational logic 350A includes inverter 750, inverter 752 and NOR gate 754. More specifically, input signal IN is input to inverter 750, and NET120 is input to inverter 752. The outputs of inverters 750 and 752 are input to NOR gate 754. The output of NOR gate 754 drives NET122. FIG. 7B is a logic diagram of another alternative combinational logic 350B that may be substituted for combinational logic 350. Combinational logic 350B includes AND gate 760 and delay element 762. More specifically, input signal IN and NET 120 are input to AND gate 760. The output of AND gate 760 is input to delay element 762. The output of delay element 762 drives NET 122. Combinational logic 350, 350A and 350B are merely exemplary and not to be construed as the only logically equivalent combinations of gates that may be used in a skewed inverter rising logic device 300 according to the present invention. Other logically equivalent combinations of gates producing an "AND" function with two gate delays may also be used with the skewed inverter rising logic device 300, and are thus also within the scope of the invention.

Figure 8:
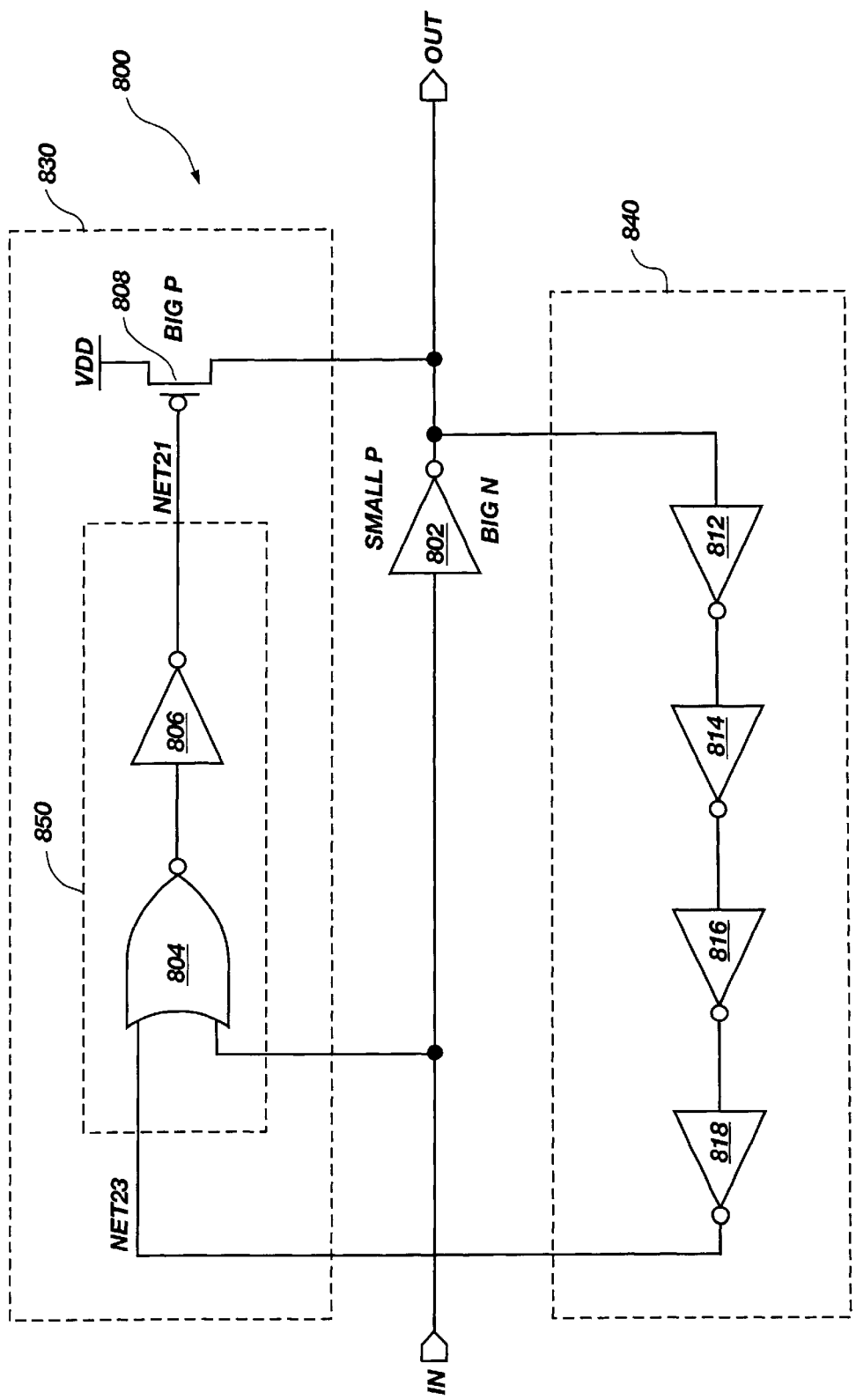
FIG. 8 is a schematic diagram of an embodiment of a skewed inverter falling logic device with a fast falling edge in accordance with the invention.

FIG. 8 is a schematic diagram of an embodiment of a skewed inverter falling logic device 800 in accordance with the present invention. Skewed inverter falling logic device 800 includes fast inverter 802, pull-up reset network 830 and feedback delay circuit 840. The external signals of the skewed inverter falling logic device 800 are input signal IN and output signal OUT. Input signal IN is input to fast inverter 802. Fast inverter 802 directly drives output signal OUT. Fast inverter 802 has an NMOS transistor (not shown) having a relatively wide n-channel width (denoted "BIG N" in FIG. 8) and a complementary PMOS transistor (not shown) having a relatively narrow p-channel width (denoted "SMALL P" in FIG. 8). Because of the large n/p channel width ratio, a falling edge of an output signal OUT will propagate very rapidly through fast inverter 802.

Pull-up reset network 830 may include combinational logic 850 and big PMOS transistor 808. Note that big PMOS transistor 808 has a relatively wide p-channel (denoted "BIG P" in FIG. 8), thus facilitating high-speed switching when big PMOS transistor 808 turns on, i.e., when receiving a low on signal NET21 or the gate node of big PMOS transistor 808. As shown in FIG. 8, combinational logic 850 includes the series combination of NOR gate 804 and inverter 806. Of course, one of skill in the art will recognize that other combinations of logic gates may be used to accomplish a logical "OR" function and timing of combinational logic 850, for example and not by way of limitation, see FIGS. 12A and 12B and related discussion below.

Pull-up reset network 830 includes two inputs and selectively drives big PMOS transistor 808. More specifically, input signal IN and node NET23 are inputs to NOR gate 804. The output of NOR gate 804 is input to inverter 806, which in turn outputs node NET21. Node NET21 drives the gate node of big PMOS transistor 808. The source node of big PMOS transistor 808 is coupled to the supply voltage, VDD. The drain node of big PMOS transistor 808 is coupled to output signal OUT. Thus, when node NET21 is low, big PMOS transistor 808 pulls the output signal OUT to supply voltage, VDD.

Feedback delay circuit 840 may include four serially connected inverters 812, 814, 816 and 818. Output signal OUT is input to feedback delay circuit 840 which outputs signal NET23. More specifically, output signal OUT is input to inverter 812. The output of inverter 812 is input to inverter 814. The output of inverter 814 is input to inverter 816. The output of inverter 818 is node NET23. One of ordinary skill in the art will recognize that each inverter 812, 814, 816 and 818 may be implemented with two or more MOS transistors appropriately configured. Other suitable combinations of logic gates having equivalent logical function and timing may be substituted for inverters 812, 814, 816 and 818. For example and not by way of limitation, four serially connected buffers or two serially connected buffers and two serially connected inverters may be substituted for inverters 812, 814, 816 and 818, consistent with the present invention. Such substitutions are contemplated as being within the scope of the present invention.

Figure 9:
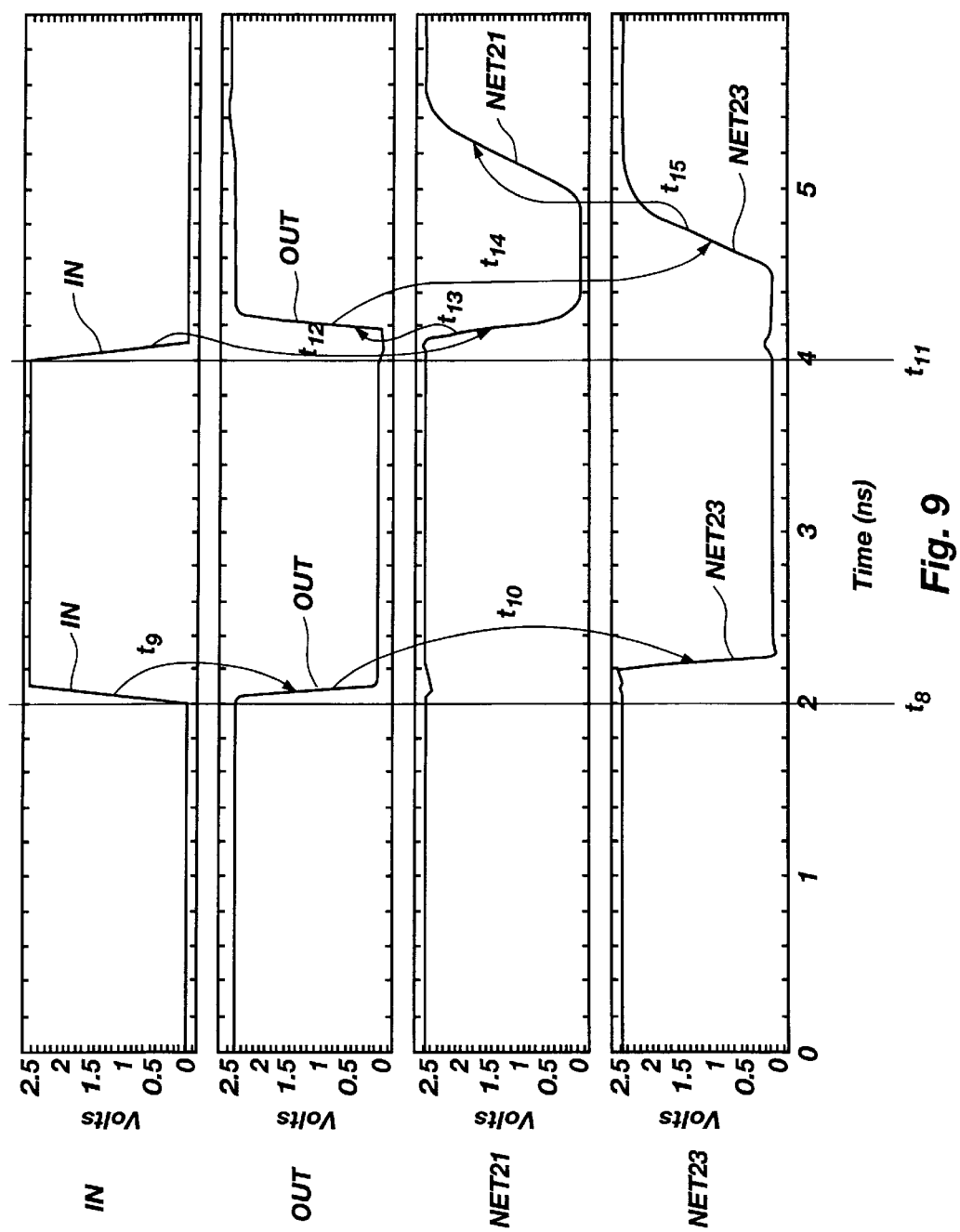
FIG. 9 is a timing diagram of the embodiment of a skewed inverter falling logic device with a fast falling edge shown in FIG. 8.

The operation of skewed inverter falling logic device 800, as shown in FIG. 8, is described with reference to the timing diagram of FIG. 9. FIG. 9 is a timing diagram of signals IN, OUT, NET21 and NET23 as shown in FIG. 8. At time $t_8$, input signal IN is low, output signal OUT is high, node NET21 is high and node NET23 is high. During time $t_9$, input signal IN transitions high, rapidly driving the output signal OUT low.

The transition of input signal IN from low to high during time period $t_9$ does not propagate through pull-up reset network 830. More specifically, at time $t_8$, the inputs to NOR gate 804 are low and high from input signals IN and NET23, respectively. Thus, the output of NOR gate 804 at time $t_8$ is low. When input signal IN transitions high, both inputs to NOR gate 804 are high and the output is still low.

However, the transition of output signal OUT from high to low during time period $t_{10}$ propagates through feedback delay circuit 840, causing node NET23 to transition low. More specifically, with output signal OUT low, the output of inverter 812 goes high. The high input to inverter 814 results in an output low, which in turn causes inverter 816 to output high and, finally, inverter 818 to drive node NET23 low.

At time $t_{11}$, input signal IN is high, output signal OUT is low, NET21 is high and NET23 is low. The transition of input signal IN from high to low during time period $t_{12}$ propagates through NOR gate 804 and inverter 806. More specifically, a low on both input signal IN and NET23 causes NOR gate 804 to output high. The high input to inverter 806 drives NET21 low. A low on NET21 turns on big PMOS transistor 808, thus resetting the output signal OUT to a high during time period $t_{12}$. As input signal IN transitions low beginning at time $t_{11}$, output signal OUT begins to transition to a high state through fast inverter 802. Fast inverter 802 is unable to switch the output signal OUT by itself However, with a "SMALL P" channel, fast inverter 802 reinforces the high established by the big PMOS transistor 808.

The rising edge of output signal OUT propagates through feedback delay circuit 840, causing node NET23 to transition high during time period $t_{14}$. More specifically, with output signal OUT high, inverter 812 outputs low. A low input to inverter 814 drives the input to inverter 816 high, causing inverter 816 to output low. The low input to inverter 818 drives node NET23 high. The rising edge of node NET23 propagates through pull-up reset network 830 and turns off big PMOS transistor 808 during time period $t_{15}$ More specifically, as NET23 transitions high, with input signal IN low, the output of NOR gate 804 goes low. The low input to inverter 806 drives NET21 high, turning off big PMOS transistor 808.

Figure 10:
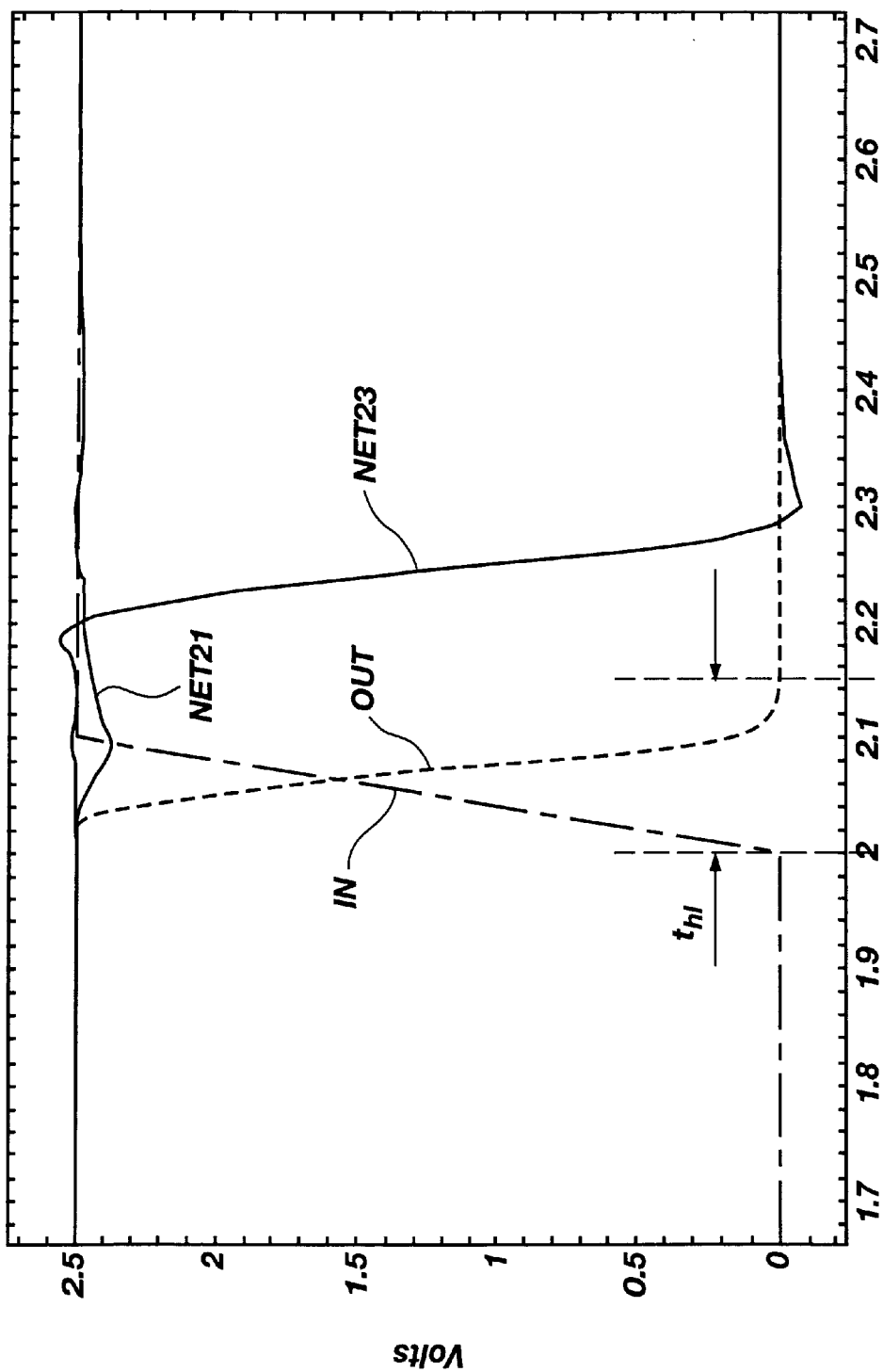
FIG. 10 is an expanded timing diagram corresponding to time $t_8$ through time $t_9$ as indicated in FIG. 9 with input, output and internal node signals superimposed.

FIG. 10 is an expanded timing diagram corresponding to time $t_8$ through time period $t_9$ as indicated in FIG. 9 with signals IN, OUT, NET21 and NET23 superimposed. FIG. 10 also illustrates the period of time, $t^{hl}$, for input signal IN to go high and output signal OUT to go low. The short duration of time period $t_{hl}$, during which output signal OUT transitions from high to low, is extremely fast relative to conventional (unskewed CMOS) circuitry and comparable to the speeds obtained with conventional domino logic.

Figure 11:
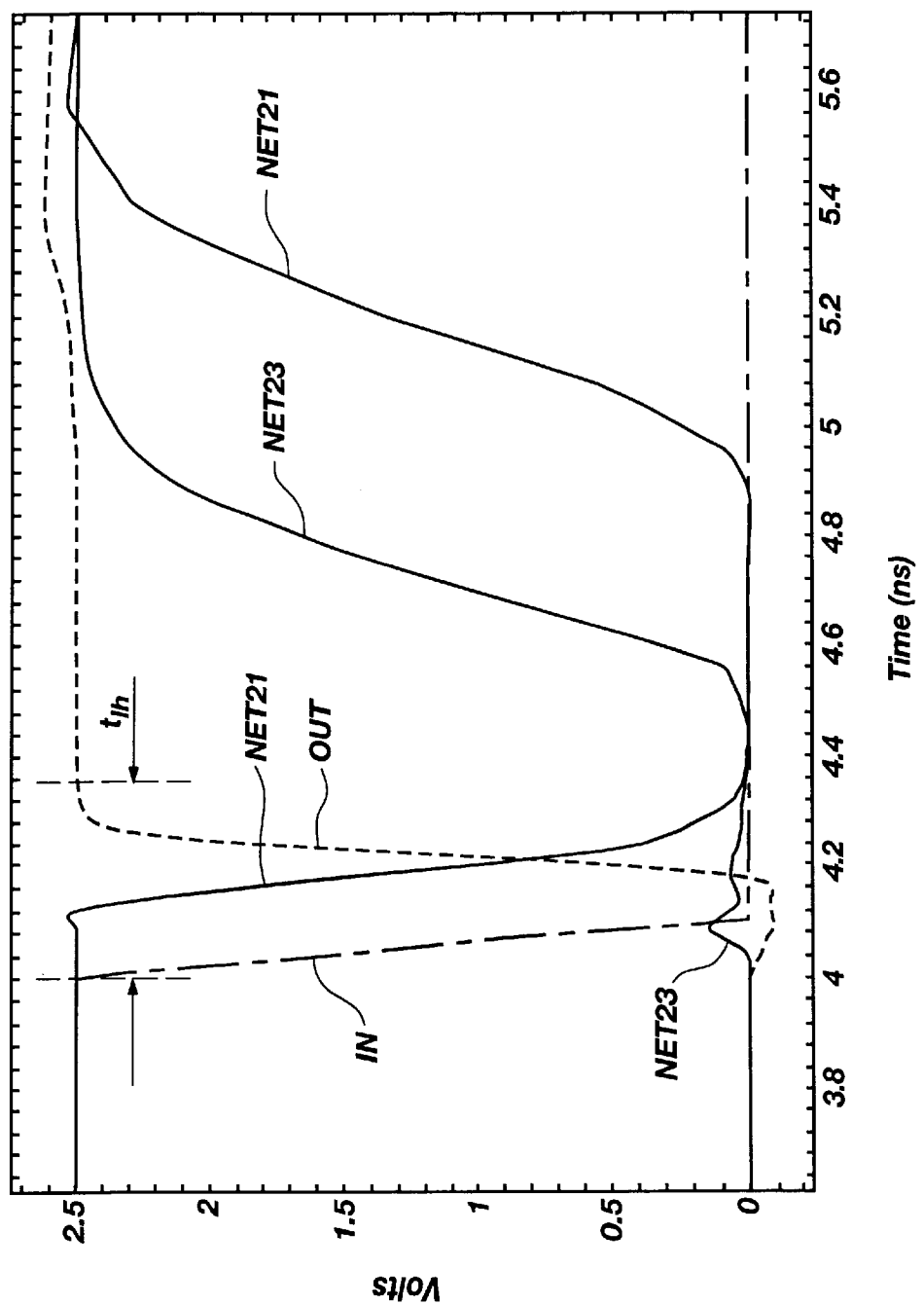
FIG. 11 is an expanded timing diagram corresponding to time $t_{11}$ through time $t_{15}$ as indicated in FIG. 9 with input, output and internal node signals superimposed.

FIG. 11 is an expanded timing diagram corresponding to time $t_{11}$ through time period $t_{15}$ as indicated in FIG. 9 with signals IN, OUT, NET21 and NET23 superimposed. FIG. 11 also illustrates the period of time, $t_{lh}$, for input signal IN to go low and output signal OUT to go high.

Figure 12A:
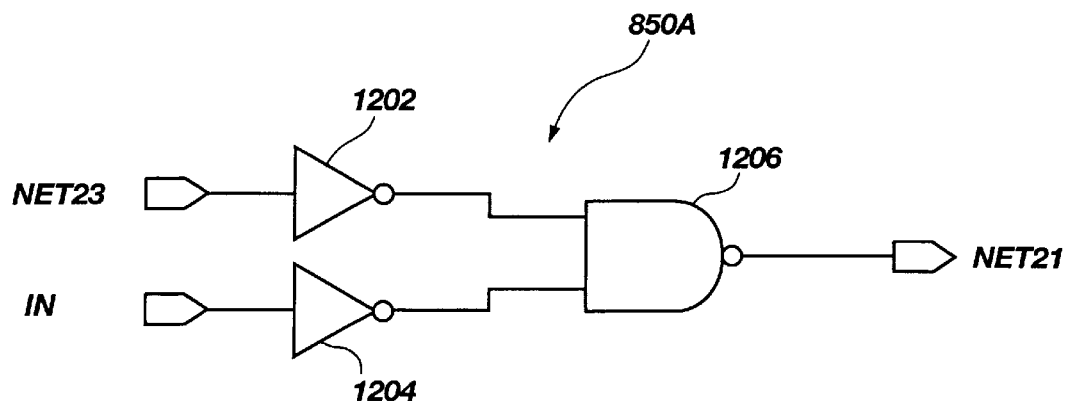
FIGS. 12A and 12B are schematic diagrams of alternative combinational logic which may be used in the skewed inverter falling logic device of FIG. 8.
Figure 12B:
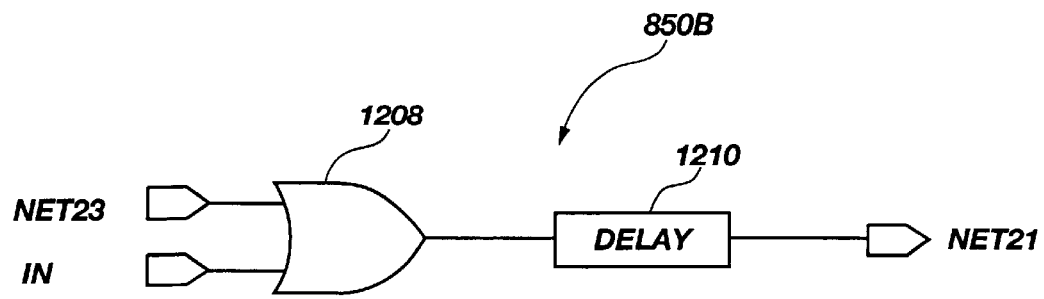

FIGS. 12A and 12B are logic diagrams of alternative combinational logic (850A and 850B, respectively) which may be used in the skewed inverter falling logic device 800 of FIG. 8. Referring to FIG. 12A, combinational logic 850A includes inverter 1202, inverter 1204 and NAND gate 1206. More specifically, input signal IN is input to inverter 1204, and node NET23 is input to inverter 1202. The outputs of inverters 1202 and 1204 are input to NAND gate 1206. The output of NAND gate 1206 drives node NET21. One of ordinary skill in the art will recognize that inverters 1202 and 1204 in combination with NAND gate 1206 as shown in FIG. 12 are logically and timing equivalent to NOR gate 804 and inverter 806 as configured and shown in FIG. 8. Referring to FIG. 12B, combinational logic 850B includes OR gate 1208 and delay element 1210. More specifically, input signal IN and NET23 are input to OR gate 1208. The output of OR gate 1208 is input to delay element 1210. The output of delay element 1210 drives NET21. Combinational logic 850, 850A and 850B are merely exemplary embodiments of combinational logic suitable for use with skewed inverter falling logic device 800. Other logically equivalent combinations of gates producing an "OR" function with two gate delays may be substituted for combinational logic 850, 850A and 850B and are contemplated within the scope of the invention.

The skewed inverters 300, 800 of the present invention may be used in logic circuits to perform many different functions in addition to inverting an input signal. The term "skewed inverter," by itself, is inclusive of the terms "skewed inverter rising logic device" and "skewed inverter falling logic device." The term "skewed inverter rising logic device" 300 may also be referred to herein by the acronym "SKINVR" 300 or simply "skewed inverter rising" 300. Similarly, the term "skewed inverter falling logic device" 800 may also be referred to herein by the acronym "SKINVF" 800 or simply "skewed inverter falling" 800. A series of alternating SKINVR 300 and SKINVF 800 may be used to rapidly propagate rising and falling edges.

Figure 13A:
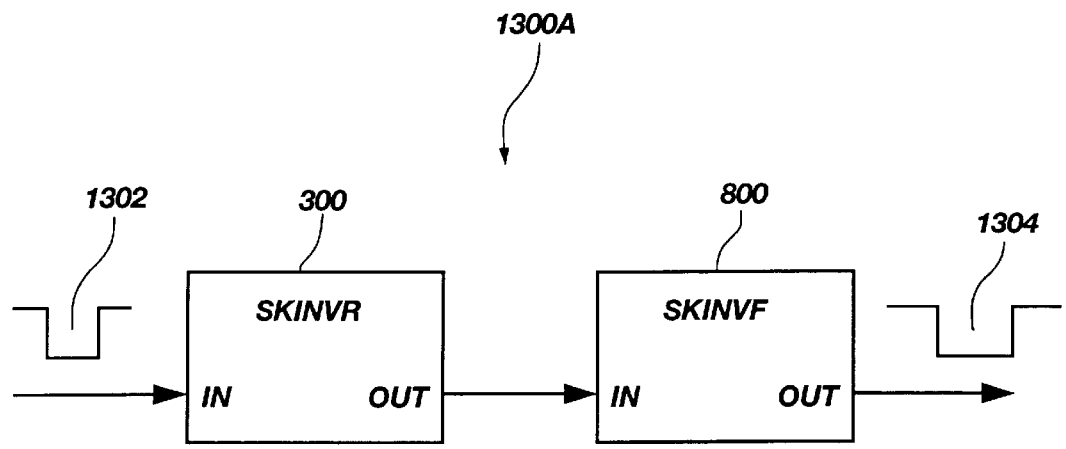
FIGS. 13A and 13B are schematic diagrams of downward and upward pulse stretchers, respectively, incorporating skewed inverter logic devices of the present invention.
Figure 13B:
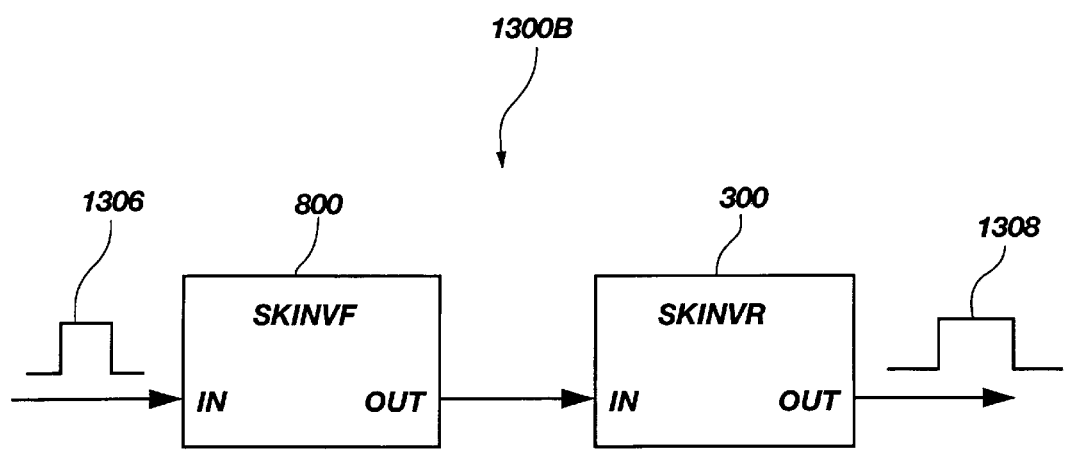

Referring to FIG. 13A, a SKINVR 300 may be used serially with a SKINVF 800 as a downward pulse stretcher 1300A for an input downward pulse. The operation of a downward pulse stretcher 1300A is as follows. A downward pulse 1302 is input to a SKINVR 300. The output of SKINVR 300 is input to SKINVF 800. The output of SKINVF 800 is a wider or "stretched" downward pulse 1304. FIG. 13B illustrates a schematic diagram of an upward pulse stretcher 1300B. Upward pulse stretcher 1300B includes serially connected SKINVF 800 with SKINVR 300. The operation of an upward pulse stretcher 1300B includes inputting an upward pulse 1306 into SKINVF 800. The output of SKINVF 800 is input to SKINVR 300. The output of SKINVR 300 is a wider or "stretched" upward pulse 1308. One skilled in the art will recognize that any number of downward pulse stretchers 1300A or upward pulse stretchers 1300B may be connected in series to effect further pulse stretching. Additionally, one skilled in the art will recognize that pulse stretchers that invert, i.e., an input upward pulse, output as a stretched downward pulse, or vice versa, may also be formed of serial combinations of SKINVR 300 and SKINVF 800 devices. Other skewed logic devices may be formed using logic gates with skewed trip points similar to those illustrated above.

Figure 14:
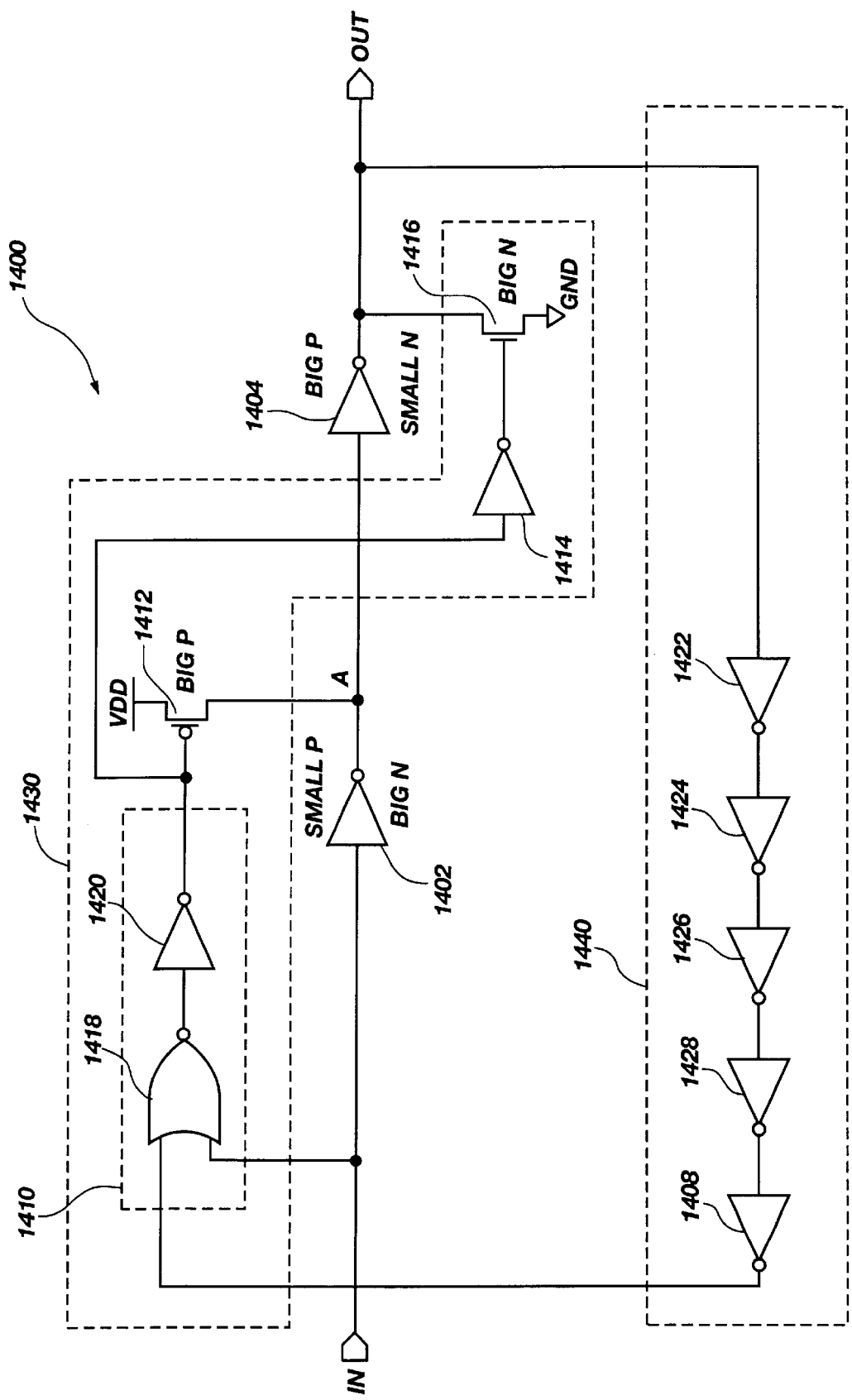
FIG. 14 is schematic diagram of a skewed buffer rising logic device for rapidly propagating a rising edge of an output signal in accordance with the present invention.

FIG. 14 is a schematic diagram of a skewed buffer rising logic device 1400 for rapidly propagating a rising edge of an output signal OUT, in accordance with the present invention. Skewed buffer rising logic device 1400 includes a fast inverter falling 1402, a fast inverter rising 1404, a reset network 1430 and a feedback delay circuit 1440. Fast inverter falling 1402 includes a large n/p channel width ratio (denoted "SMALL P" and "BIG N" in FIG. 14) for receiving a rising edge of an input signal IN and rapidly propagating a falling edge of an intermediate signal A in response thereto. The input to fast inverter falling 1402 is input signal IN. Intermediate signal A is input to fast inverter rising 1404. The output of fast inverter rising 1404 is output signal OUT. Fast inverter rising 1404 includes a large p/n channel width ratio (denoted "BIG P" and "SMALL N" in FIG. 14) and receives the rapidly propagated falling edge of intermediate signal A and rapidly propagates a rising edge on the output signal OUT. Reset network 1430 is connected to fast inverter falling 1402 and fast inverter rising 1404 and resets output signals of fast inverter falling 1402 and fast inverter rising 1404 after the rising edge of an output signal OUT has been rapidly propagated. Feedback delay circuit 1440 is connected between an output of fast inverter rising 1404 and an input of reset network 1430 for propagating output signal OUT to the reset network 1430.

Reset network 1430 includes combinational logic 1410 for receiving input signal IN and a PMOS pull-up transistor 1412 having a wide p-channel (denoted "BIG P") with a gate node driven by an output of the combinational logic 1410, a source node connected to supply voltage VDD and a drain node connected to intermediate signal A for pulling intermediate signal A up to supply voltage VDD in response to a low signal on the gate node. Reset network 1430 also includes an inverter 1414 having an input connected to the gate node of PMOS pull-up transistor 1412 and an NMOS pull-down transistor 1416 having a wide n-channel (denoted "BIG N") having a gate node connected to the output of inverter 1414, a drain node connected to output signal OUT and a source node connected to ground potential GND.

Combinational logic 1410 performs a logical "OR" function. Combinational logic 1410, as shown in FIG. 14, may include a NOR gate 1418 with a first input connected to input signal IN and a second input connected to an output of feedback delay circuit 1440. Combinational logic 1410 may further include inverter 1420 having input connected to the output of NOR gate 1418 and having an output connected to the gate node of PMOS pull-up transistor 1412. Of course, other logically equivalent and timing equivalent combinations of logic gates may be substituted for NOR gate 1418 and inverter 1420 of combinational logic 1410 and still remain within the scope of the present invention.

Feedback delay circuit 1440 may include five serially connected inverters 1422, 1424, 1426, 1428 and 1408 as shown in FIG. 14. Of course, other logically equivalent combinations of logic gates having about five gate delays may also be substituted for the five serially connected inverters 1422, 1424, 1426, 1428 and 1408, as known to one of ordinary skill in the art, and yet remain within the scope of the present invention.

Figure 15:
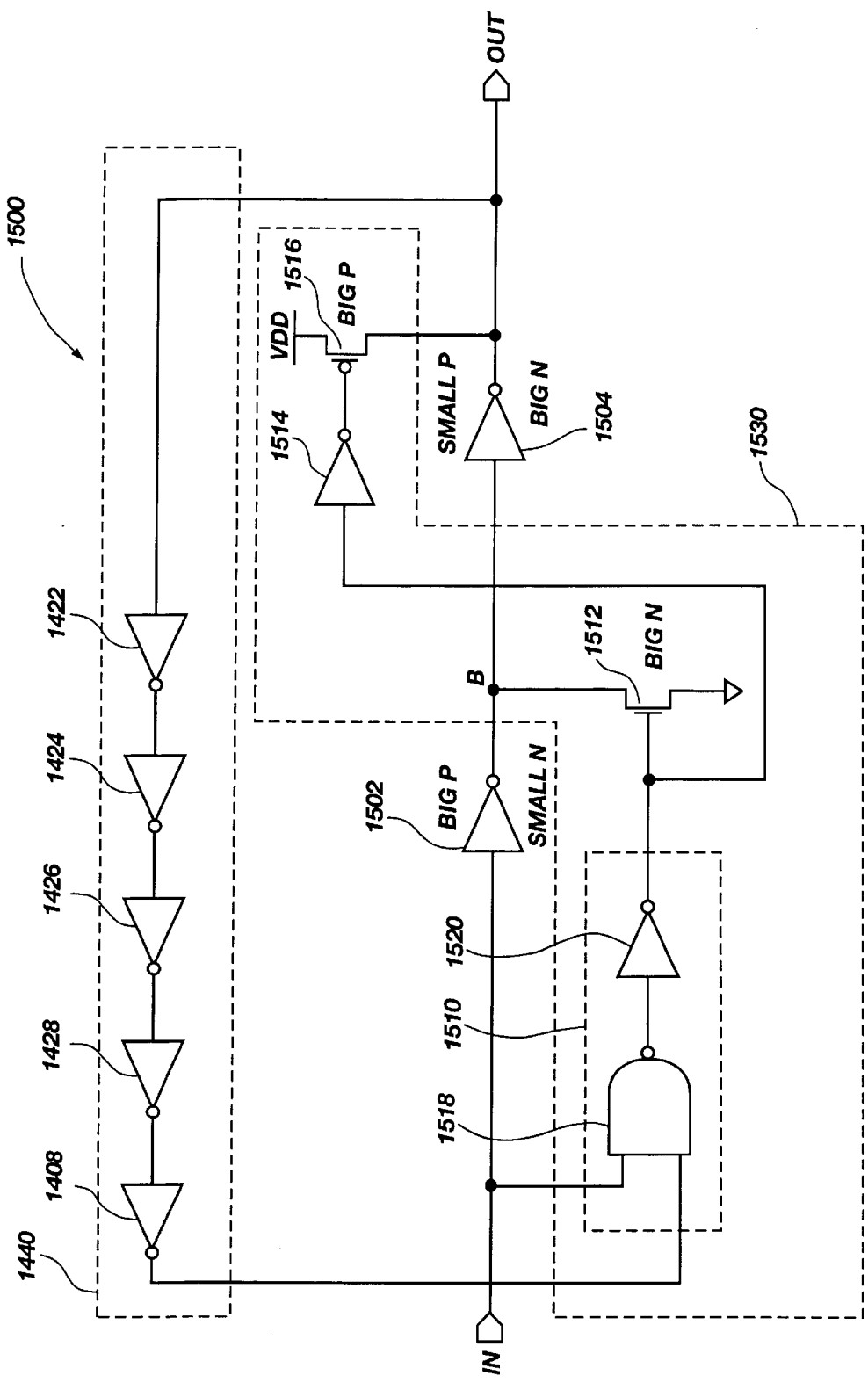
FIG. 15 is a schematic diagram of a skewed buffer falling logic device for rapidly propagating a falling edge of an output signal in accordance with the present invention.

FIG. 15 is a schematic of a skewed buffer falling logic device 1500 for rapidly propagating a falling edge of an output signal OUT, in accordance with the present invention.

Skewed buffer falling logic device 1500 includes a fast inverter rising 1502, fast inverter falling 1504, a reset network 1530 and a feedback delay network 1440. Input signal IN is input to fast inverter rising 1502, which in turn outputs intermediate signal B. Fast inverter rising 1502 includes a large p/n channel width ratio (denoted "BIG P" and "SMALL N" in FIG. 15) for receiving a falling edge of input signal IN and rapidly propagating a rising edge of intermediate signal B in response thereto. Fast inverter falling 1504 is connected in series with fast inverter rising 1502 for receiving intermediate signal B and rapidly propagated a falling edge on the output signal OUT. Fast inverter falling 1504 includes a large n/p channel width ratio, denoted "SMALL P" and "BIG N" in FIG. 15.

Reset network 1530 is connected to fast inverter rising 1502 and to fast inverter falling 1504 and resets output signals of both fast inverter rising 1502 and fast inverter falling 1504 after the falling edge of output signal OUT has been rapidly propagated through skewed buffer falling logic device 1500. Reset network 1530 may include combinational logic 1510 for receiving input signal IN and an NMOS pull-down transistor 1512 having a wide n-channel (denoted "BIG N"), a gate node connected to the output of combinational logic 1510, a drain node connected to intermediate signal B and a source node connected to ground potential, GND. Reset network 1530 may further include an inverter 1514 having input connected to the gate node of NMOS pull-down transistor 1512 and a PMOS pull-up transistor 1516 having a wide p-channel (denoted "BIG P") and having a gate node driven by inverter 1514, a source node connected to supply voltage VDD and a drain node connected to output signal OUT. Feedback delay circuit 1440 is connected between the output of fast inverter falling 1504 and an input of reset network 1530 for propagating output signal OUT to reset network 1530.

Combinational logic 1510 performs a logical "AND" function with about two gate delays. Combinational logic 1510 may include a NAND gate 1518 with a first input connected to the input signal IN and a second input connected to an output of feedback delay circuit 1440. Combinational logic 1510 may further include inverter 1520 having an input connected to the output of NAND gate 1518 and having an output connected to the gate node of the NMOS pull-down transistor 1512. Of course, other logically equivalent and timing equivalent combinations of logic gates may be substituted for combinational logic 1510 and still remain within the scope of the present invention.

Figure 16:
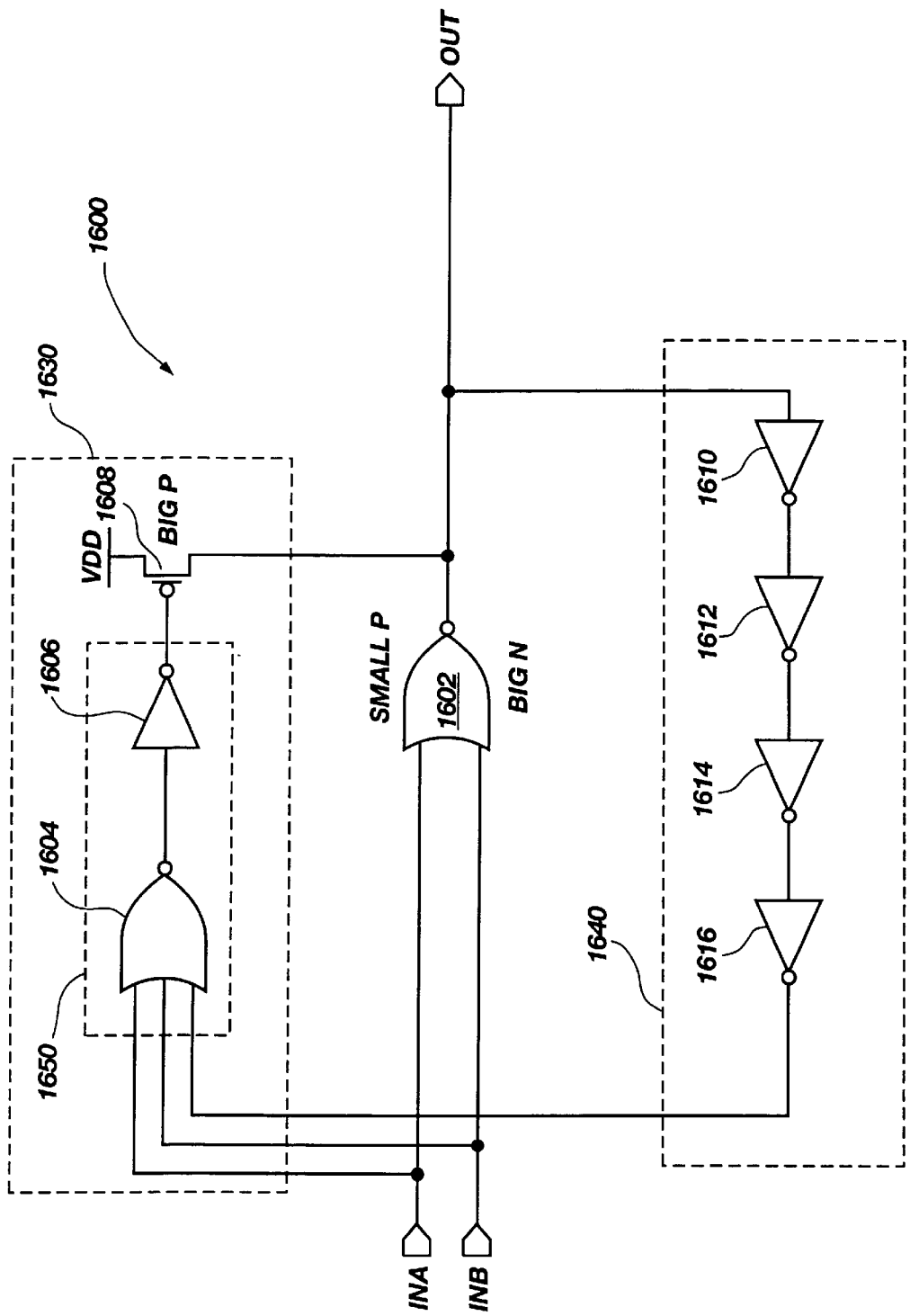
FIG. 16 is a schematic diagram of a skewed NOR falling logic device for rapidly propagating a falling edge of an output signal, in accordance with the present invention.

FIG. 16 is a schematic diagram of a skewed NOR falling logic device 1600 for rapidly propagating a falling edge of an output signal OUT, in accordance with the present invention. Skewed NOR falling logic device 1600 may include a fast NOR gate falling 1602, a pull-up reset network 1630 and a feedback delay circuit 1640, as shown in FIG. 16. Fast NOR gate falling 1602 includes a large n/p channel width ratio (denoted "BIG N" and "SMALL P" in FIG. 16) for receiving first and second input signals and rapidly propagating a falling edge of the output signal OUT in response to a rising edge on either of the first input signal INA or the second input signal INB.

Pull-up reset network 1630 is connected in parallel with fast NOR gate falling 1602 for resetting output signal OUT after the "fast" edge, i.e., a falling edge, has been propagated to output signal OUT. Pull-up reset network 1630 may include combinational logic 1650 and a big PMOS transistor 1608. Combinational logic 1650, as shown in FIG. 16, may include a 3-input NOR gate 1604 in series with inverter 1606, which in turn drives the gate node of big PMOS transistor 1608. Three-input NOR gate 1604 has a first input connected to first input signal INA, a second input connected to second input signal INB, a third input connected to the output of feedback delay circuit 1640 and an output connected to the input of inverter 1606. Big PMOS transistor 1608 has a wide p-channel (denoted "BIG P") with a gate node connected to the output of combinational logic 1650, a source node connected to supply voltage VDD and a drain node connected to the output signal OUT. Combinational logic 1650 performs a logical "OR" function with approximately two gate delays. Of course, other logically equivalent and timing equivalent combinations of logic gates may be substituted for the combinational logic 1650 by one of ordinary skill in the art, without departing from the scope of the present invention.

Feedback delay circuit 1640 propagates the output signal OUT through feedback delay circuit 1640 and provides the delayed output signal OUT as an input to pull-up reset network 1630. Thus, feedback delay circuit 1640 is connected in parallel with pull-up reset network 1630. As shown in FIG. 16, feedback delay circuit 1640 may include four inverters 1610, 1612, 1614 and 1616 connected in series and providing a delay of approximately four gate delays in duration. Of course, other suitable combinations of logic gates and/or delay elements may be substituted for the four inverters 1610, 1612, 1614 and 1616 of feedback delay circuit 1640. Such substitutions are within the knowledge of one of ordinary skill in the art and are within the scope of the present invention.

Figure 17:
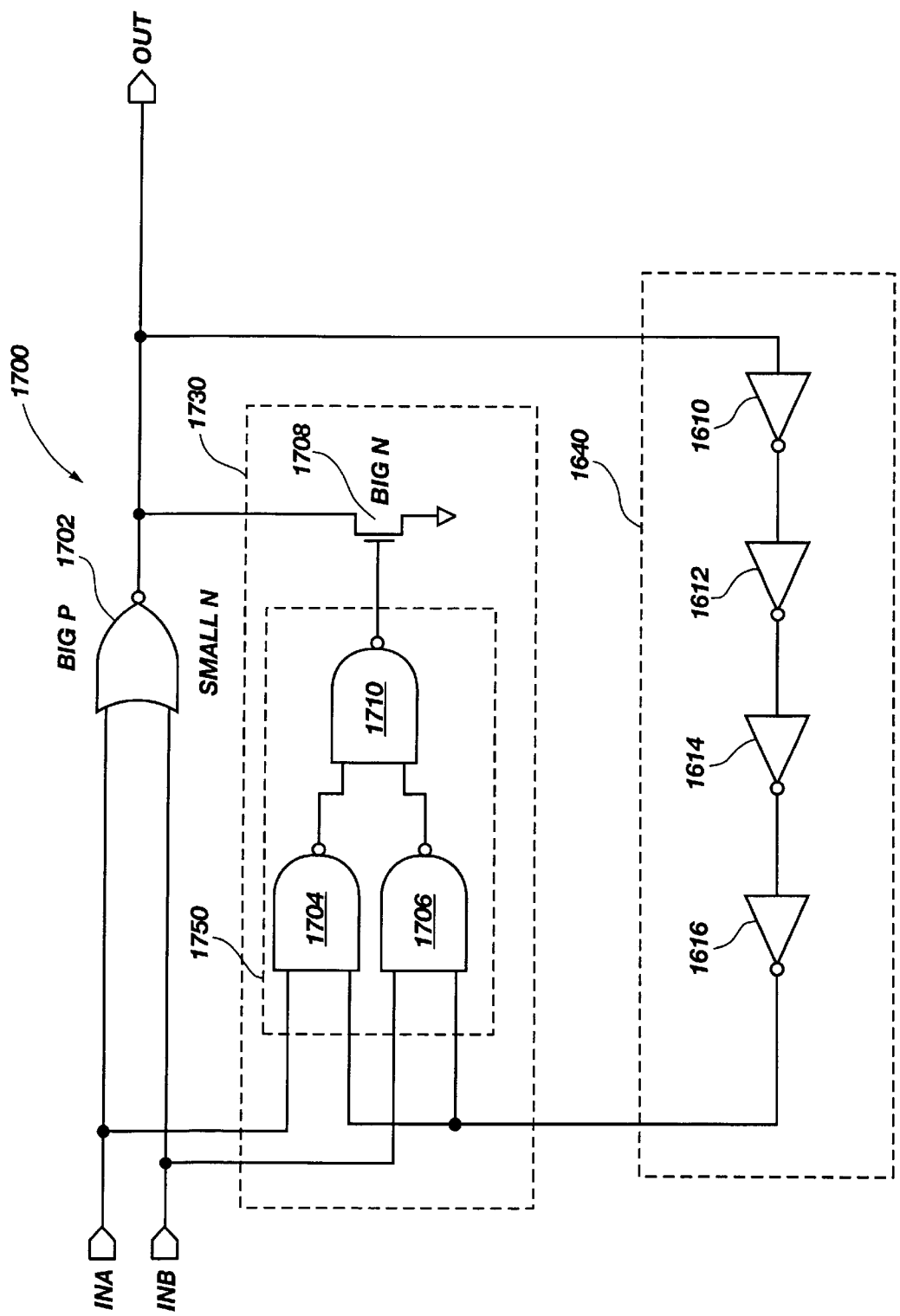
FIG. 17 is a schematic diagram of a skewed NOR rising logic device configured for rapidly propagating a rising edge of an output signal in accordance with the present invention.

FIG. 17 is a schematic diagram of a skewed NOR rising logic device 1700 for rapidly propagating a rising edge of an output signal OUT, in accordance with the present invention. Skewed NOR rising logic device 1700 includes fast NOR gate rising 1702, pull-down reset network 1730 and feedback delay circuit 1640. Note that fast NOR gate rising 1702 is denoted "BIG P" and "SMALL N" for relatively wide p-channel widths and relatively narrow n-channel widths and thus, will rapidly propagate the rising edge of output signal OUT in response to a falling edge on both the first input signal INA and the second input signal INB. Pull-down reset network 1730 is connected in parallel with fast NOR gate rising 1702. Feedback delay circuit 1640 is connected in parallel with pull-down reset network 1730, and may include four inverters 1610, 1612, 1614 and 1616 connected in series, providing a delay of approximately four gate delays in duration.

Pull-down reset network 1730 may include combinational logic 1750 connected to pull-down NMOS transistor 1708. Pull-down NMOS transistor 1708 includes a relatively wide n-channel (denoted "BIG N"). Combinational logic 1750 receives inputs from input signals INA and INB and also receives an input from the output of feedback delay circuit 1640. Combinational logic 1750 performs a logical "sum of products" function with a delay of approximately two gate delays in duration. As shown in FIG. 17, combinational logic 1750 may include three NAND gates 1704, 1706 and 1710. NAND gate 1704 has a first input connected to first input signal INA, a second input connected to the output of feedback delay circuit 1640 and an output connected to a first input of NAND gate 1710. NAND gate 1706 has a first input connected to second input signal INB, a second input connected to the output of feedback delay circuit 1640 and an output connected to a second input of NAND gate 1710. The output of NAND gate 1710 is connected to a gate node of pull-down NMOS transistor 1708. Of course, other suitable combinations of logic gates performing a logical "sum of products" function with a delay of approximately two gate delays in duration may be substituted for the combinational logic 1750. Such logical equivalents are within the knowledge of one of ordinary skill in the art and are also contemplated as being within the scope of the present invention.

Figure 18:
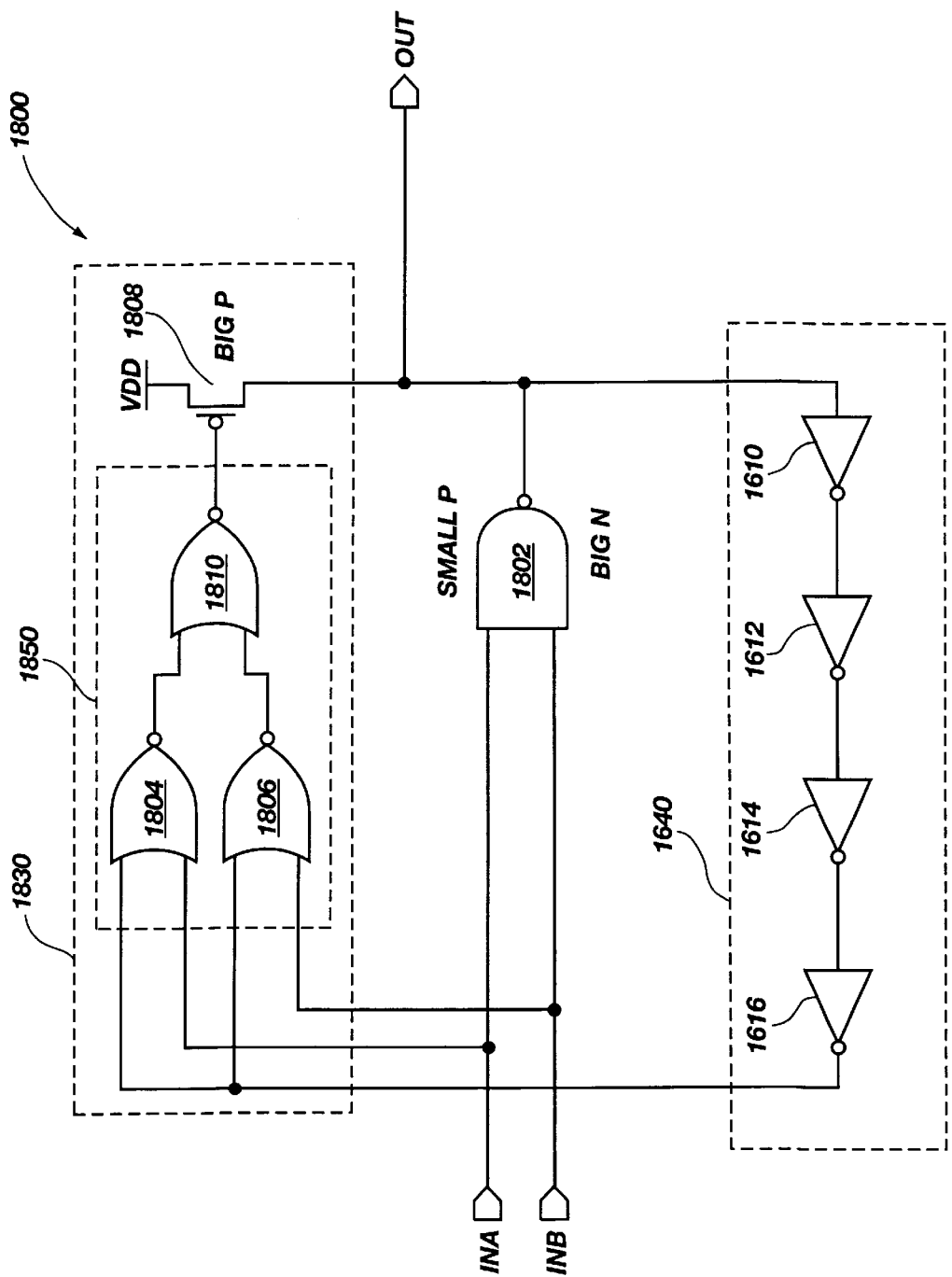
FIG. 18 is a schematic diagram of a skewed NAND falling logic device configured for rapidly propagating a falling edge of an output signal in accordance with the present invention.

FIG. 18 is a logic diagram of a skewed NAND falling logic device 1800 for rapidly propagating a falling edge of an output signal OUT, in accordance with the present invention. Skewed NAND falling logic device 1800 includes fast NAND gate falling 1802, pull-up reset network 1830 and feedback delay circuit 1640. Note that fast NAND gate falling 1802 has a relatively large n/p channel width ratio (denoted "SMALL P" and "BIG N") for relatively wide n-channel widths and relatively narrow p-channel widths and thus, will rapidly propagate the falling edge of an output signal OUT in response to rising edges on both the first input signal INA and the second input signal INB. Pull-up reset network 1830 is connected in parallel with fast NAND gate falling 1802. Feedback delay circuit 1640 is connected in parallel with pull-up reset network 1830. Feedback delay circuit 1640 may include four inverters 1610, 1612, 1614 and 1616 connected in series, providing a delay of approximately four gate delays in duration.

Pull-up reset network 1830, as shown in FIG. 18, may include combinational logic 1850 connected to big PMOS transistor 1808. Note also that big PMOS transistor 1808 has a relatively wide p-channel (denoted "BIG P"). Combinational logic 1850 receives inputs from input signals INA and INB and also receives input from the output of feedback delay circuit 1640. Combinational logic 1850 performs a logical "product of sums" function having a delay of approximately two gate delays in duration. Combinational logic 1850 may include three NOR gates 1804, 1806 and 1810, as shown in FIG. 18. NOR gate 1804 has a first input connected to first input signal INA, a second input connected to the output of feedback delay circuit 1640 and an output connected to a first input of NOR gate 1810. NOR gate 1806 has a first input connected to second input signal INB, a second input connected to the output of feedback delay circuit 1640 and an output connected to a second input of NOR gate 1810. The output of NOR gate 1810 is connected to a gate node of big PMOS transistor 1808. Of course, other suitable combinations of logic gates that perform a logical "product of sums" function with a delay of approximately two gate delays may be substituted for combinational logic 1850. Such logical equivalents are within the knowledge of one of ordinary skill in the art and are also contemplated as being within the scope of the present invention.

Figure 19:
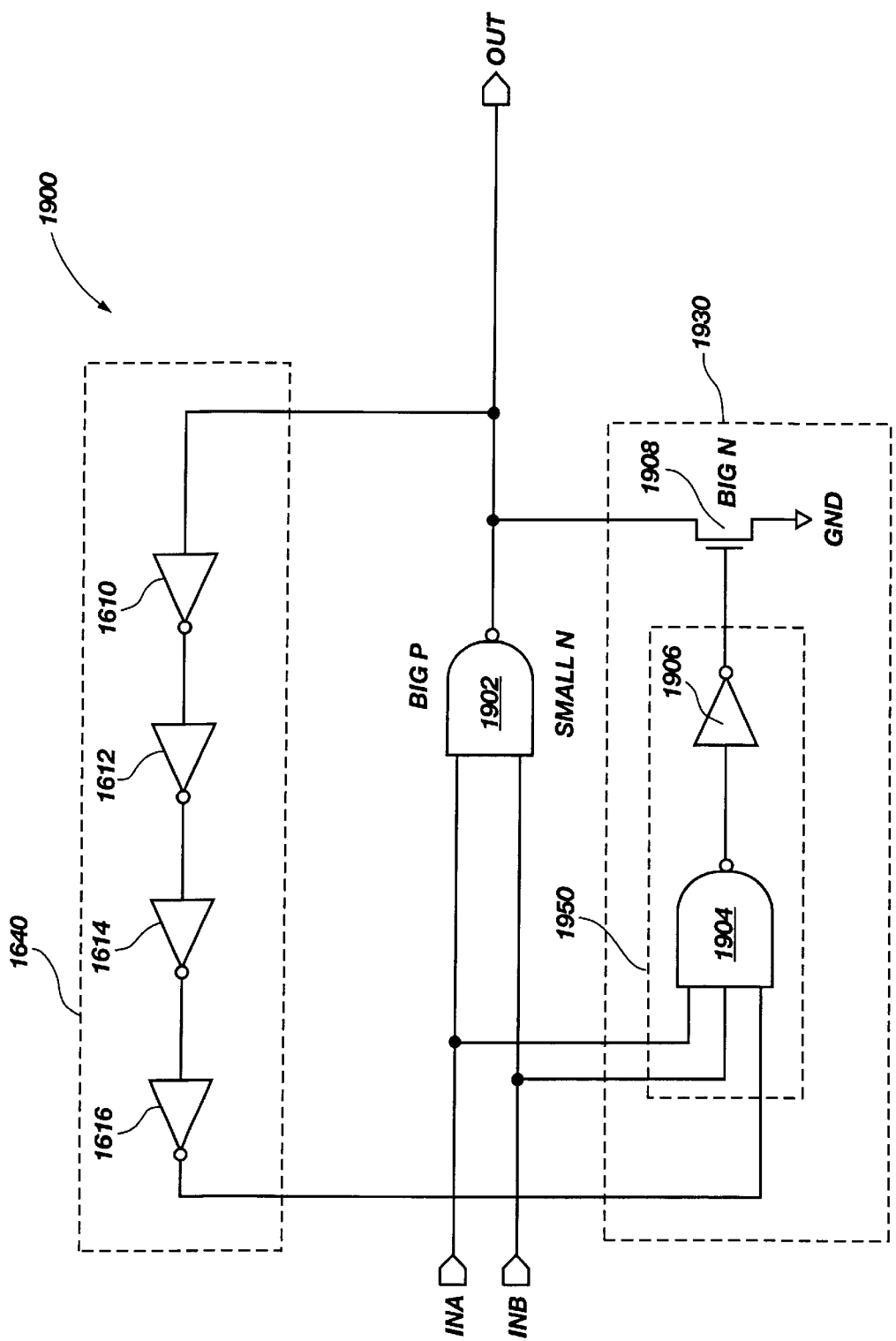
FIG. 19 is a schematic diagram of a skewed NAND rising logic device for rapidly propagating a rising edge of an output signal, in accordance with the present invention.

FIG. 19 is a schematic diagram of a skewed NAND rising logic device 1900 for rapidly propagating a rising edge of an output signal OUT, in accordance with the present invention. As shown in FIG. 19, a skewed NAND rising logic device 1900 may include a fast NAND gate rising 1902, a pull-down reset network 1930 and a feedback delay circuit 1640. Fast NAND gate rising 1902 includes a large p/n channel width ratio (denoted "BIG P" and "SMALL N") for receiving a first input signal INA and a second input signal INB and rapidly propagating a rising edge of the output signal OUT in response to falling edges on either the first input signal INA or the second input signal INB. Feedback delay circuit 1640 is connected in parallel with the pull-down reset network 1930 for delaying and returning the output signal OUT to an input of the pull-down reset network 1930. Feedback delay circuit 1640 may include four inverters 1610, 1612, 1614 and 1616 connected in series, providing a delay of approximately four gate delays in duration.

Pull-down reset network 1930 is connected in parallel with fast NAND gate rising 1902 for resetting the output signal OUT after the rising edge of the output signal OUT has been propagated. Pull-down reset network 1930 may include combinational logic 1950 having three inputs and an output, and a big NMOS transistor 1908 having a wide n-channel (denoted "BIG N"), and having a gate node connected to the output of combinational logic 1950, a drain node connected to output signal OUT and a source node connected to ground potential GND. Combinational logic 1950 performs a logical AND function with a delay of approximately two gate delays in duration. As shown in FIG. 19, combinational logic 1950 may include a 3-input NAND gate 1904 having a first input connected to the first input signal INA and a second input connected to the second input signal INB and a third input connected to the output of feedback delay circuit 1640. Combinational logic 1950 may further include an inverter 1906 having an input connected to the output of 3-input NAND gate 1904 and having an output connected to, and driving, the gate node of big NMOS transistor 1908. Of course, other suitable combinations of logic gates that perform a logical AND function with a delay of approximately two gate delays may be substituted for combinational logic 1950, as shown in FIG. 19. Such logical equivalents are within the knowledge of one of ordinary skill in the art and are also contemplated as being within the scope of the present invention.

Figure 20:
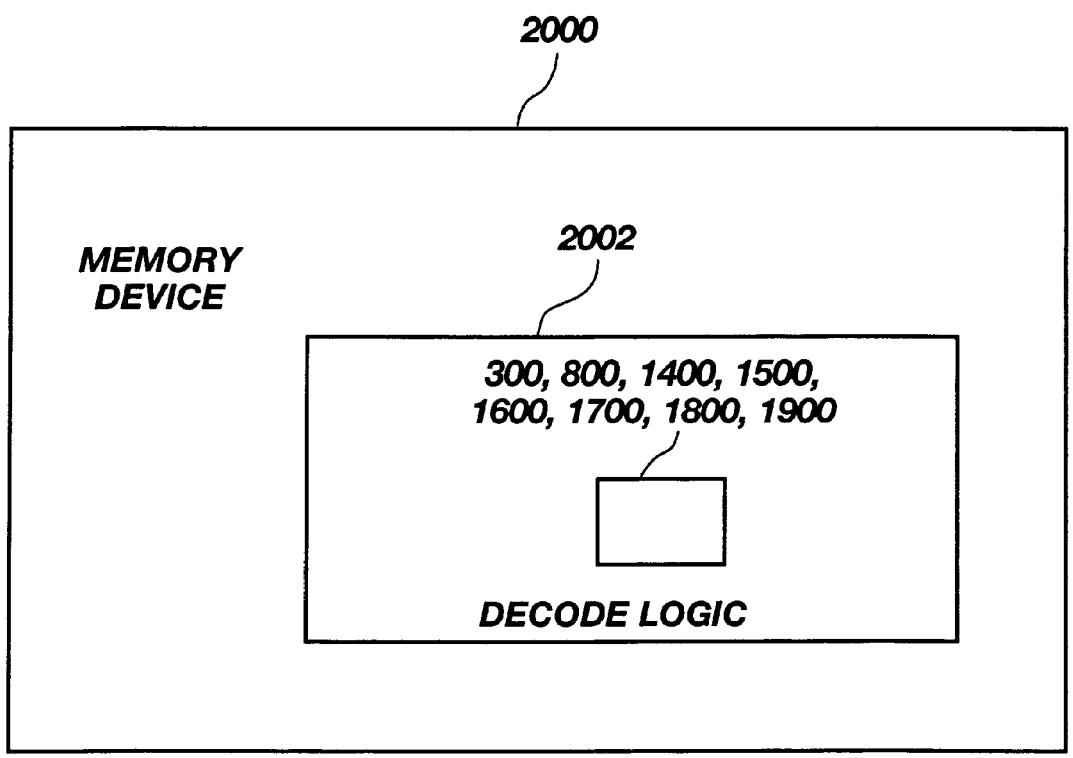
FIG. 20 is block diagram of a memory device incorporating skewed logic devices of the present invention.

The skewed logic devices 300, 800, 1400, 1500, 1600, 1700, 1800 and 1900 of the present invention (hereinafter "skewed logic devices") may be used in any higher order logical device where fast edge propagation is desired. For example, and not by way of limitation, one or more skewed logic devices may be used for fast selection in a decode for a column select in a memory device. FIG. 20 illustrates a memory device 2000. Memory device 2000 includes decode logic 2002 incorporating one or more skewed logic devices of the present invention. Memory device 2000 may be, for example and not by way of limitation, a dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), DDR synchronous SRAM (DDR SRAM) and nonvolatile electrically block-erasable programmable read only memory (Flash).

Figure 21:
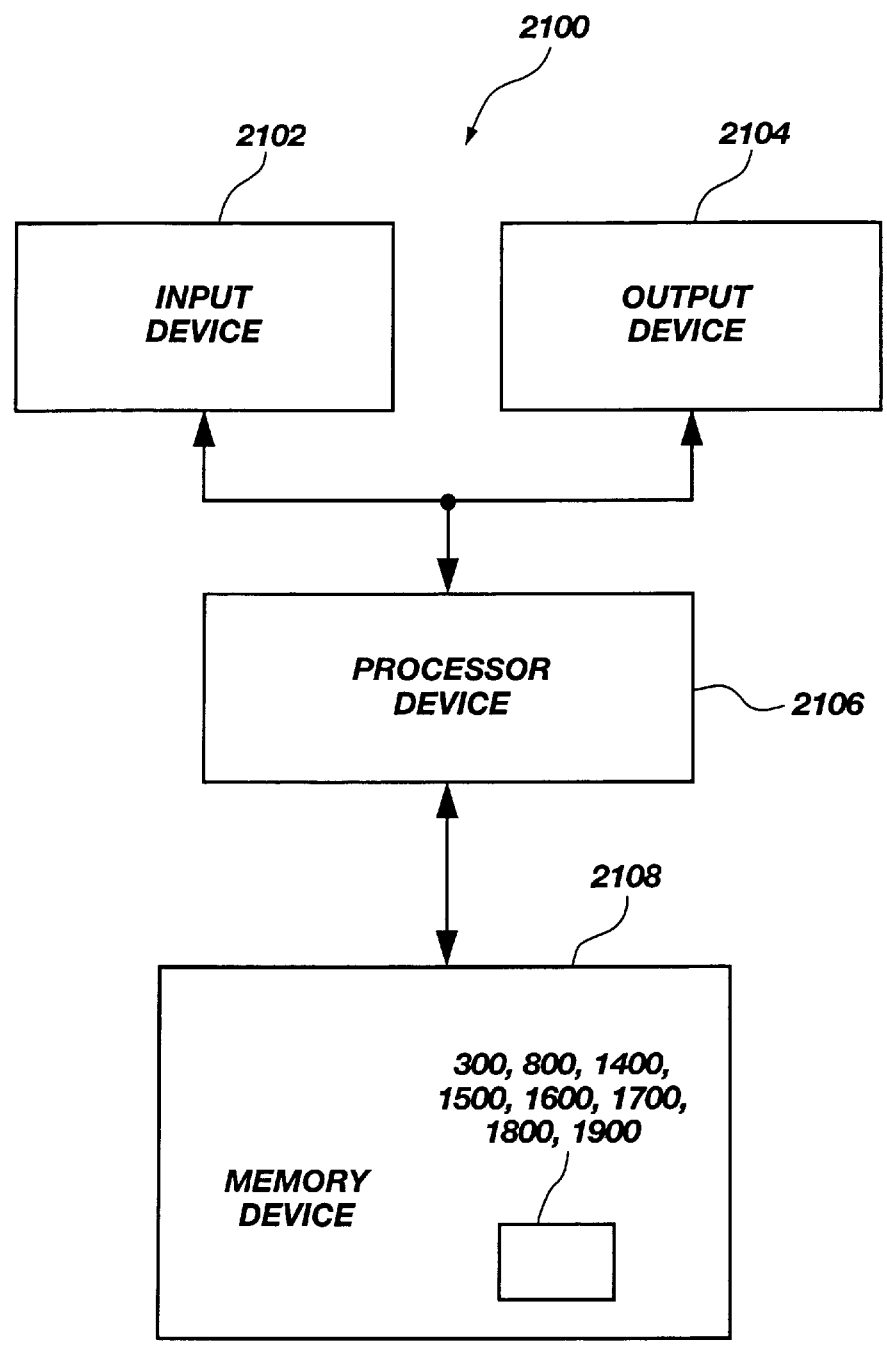
FIG. 21 is a block diagram of a computer system incorporating at least one of the skewed logic devices of the present invention.

Referring to FIG. 21, a block diagram of a computer system 2100 incorporating skewed logic devices in accordance with the present invention is shown. Computer system 2100 includes an input device 2102, an output device 2104, a processor device 2106 connected to the input device 2102 and the output device 2104 and a memory device 2108 connected to the processor device 2106. The memory device 2108 includes skewed logic devices 300, 800, 1400, 1500, 1600, 1700, 1800, 1900 of the present invention. Memory device 2108 may be, for example and not by way of limitation, a dynamic random access memory (DRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM), Quad Data Rate™ SRAM (QDR™ SRAM), DDR synchronous SRAM (DDR SRAM) and nonvolatile electrically block-erasable programmable read only memory (Flash), as shown in FIG. 20.

Figure 22:
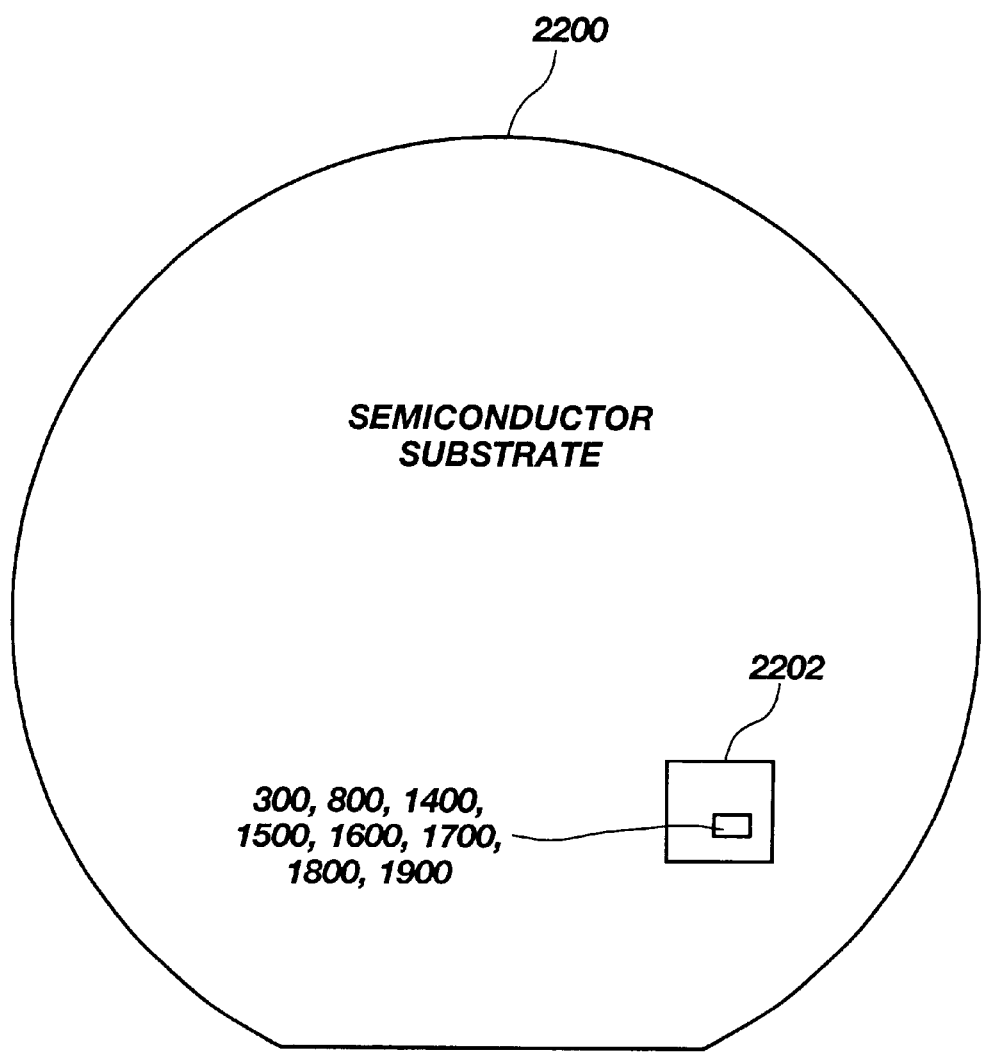
FIG. 22 is a plan view of a semiconductor substrate incorporating at least one of the skewed logic devices of the present invention.

Referring to FIG. 22, a plan view of a semiconductor substrate 2200 including at least one integrated circuit die 2202 (only one of which is shown for clarity). Each integrated circuit die 2202 includes at least one skewed logic device 300, 800, 1400, 1500, 1600, 1700, 1800, 1900 in accordance with the invention. Integrated circuit die 2202 may be a memory device 2000 as shown in FIG. 20, or it may be any other integrated circuit die that includes a skewed logic device of the present invention.

The semiconductor technology employed is not a limiting factor in the application of the skewed logic devices of the present invention. While silicon is the preferred bulk semiconductor material for commercial electronic devices, gallium arsenide and indium phosphide substrates may also be employed. Of course, it will be understood that the skewed logic devices of the present invention may be fabricated on other semiconductor substrates as well, including, for example, silicon-on-glass (SOG) substrates, silicon-on-insulator (SOI) substrates, and silicon-on-sapphire (SOS) substrates.

Figure 23:
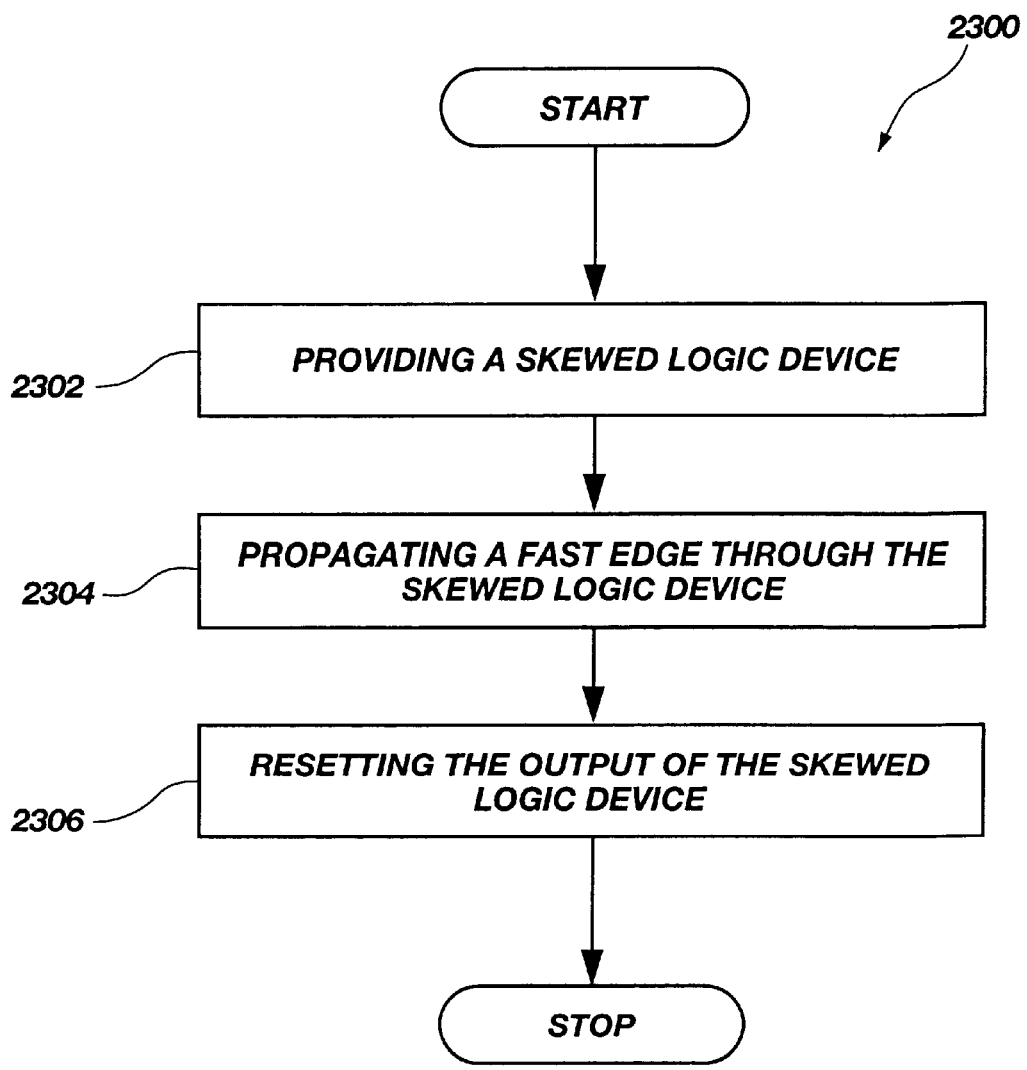
FIG. 23 is a flow chart of a method for rapidly propagating an edge of an output signal through a skewed logic device in accordance with the present invention.

FIG. 23 is a flow chart of a method 2300 for rapidly propagating a rising edge through a skewed logic device in accordance with the present invention. Method 2300 includes providing 2302 a skewed logic device. The skewed logic device may be a skewed inverter rising logic device 300, a skewed inverter falling logic device 800, a skewed buffer rising logic device 1400 and a skewed buffer falling logic device 1500, a skewed NOR falling logic device 1600, a skewed NOR rising logic device 1700, a skewed NAND falling logic device 1800, or skewed NAND rising logic device 1900, as disclosed herein. Method 2300 further includes propagating 2304 a fast edge through the skewed logic device to an output of the skewed logic device and resetting 2306 the output of the skewed logic device.

Although this invention has been described with reference to particular embodiments, the invention is not limited to these described embodiments. Rather, it should be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. A skewed inverter rising logic device for rapidly propagating a rising edge of an output signal comprising:
   a fast inverter having a large p/n channel width ratio for receiving an input signal and rapidly propagating a rising edge onto said output signal in response to receiving a falling edge on said input signal;
   a pull-down reset network connected in parallel with said fast inverter and responsive at least in part to said input signal for resetting said output signal after said rising edge has been propagated onto said output signal; and
   a feedback delay circuit connected in parallel with said pull-down reset network for delaying and returning said output signal back to said pull-down reset network.

2. The skewed inverter rising logic device of claim 1, wherein said large p/n channel width ratio ranges from about 5 to about 200.

3. The skewed inverter rising logic device of claim 1, wherein said pull-down reset network includes:
   combinational logic having a plurality of inputs and an output; and
   a big NMOS transistor having a wide n-channel greater than 10 $\mu$m across, a gate node connected to said output of said combinational logic, a drain node connected to said output signal and a source node connected to ground potential.

4. The skewed inverter rising logic device of claim 3, wherein said combinational logic performs a logical AND function including at least two gates.

5. The skewed inverter rising logic device of claim 3, wherein said combinational logic comprises:
   a NAND gate having a first input connected to said input signal and a second input connected to an output of said feedback delay circuit; and
   an inverter having an input connected to an output of said NAND gate and having an output connected to said gate node of said big NMOS transistor.

6. The skewed inverter rising logic device of claim 3, wherein said combinational logic comprises:
   a first inverter having an input connected to said input signal;
   a second inverter having an input connected to an output of said feedback delay circuit; and
   a NOR gate having a first input connected to an output of said first inverter, a second input connected to an output of said second inverter and an output connected to said gate node of said big NMOS transistor.

7. The skewed inverter rising logic device of claim 3, wherein said combinational logic comprises:
   an AND gate having a first input connected to said input signal, a second input connected to an output of said feedback delay circuit and an output; and
   a delay element having an input connected to said output of said AND gate and an output connected to said gate node of said big NMOS transistor.

8. The skewed inverter rising logic device of claim 1, wherein said feedback delay circuit comprises four inverters connected in series.

9. The skewed inverter rising logic device of claim 1, wherein said feedback delay circuit comprises four buffers connected in series.

10. The skewed inverter rising logic device of claim 1, wherein said feedback delay circuit comprises four delay elements connected in series.

* * * * *

UNITED STATES PATENT AND TRADEMARK OFFICE
CERTIFICATE OF CORRECTION

PATENT NO. : 6,628,139 B2
DATED : September 30, 2003
INVENTOR(S) : John D. Porter, Dean D. Gans and Larren G. Weber It is certified that error appears in the above-identified patent and that said Letters Patent is hereby corrected as shown below:

Title page,
Item [57], ABSTRACT,
Line 4, change "included" to -- include --
Line 11, remove "a" between "propagate" and "either"

Column 8,
Lines 4 and 7, change "NET 120" to -- NET120 --
Line 26, change "NNIOS" to -- NMOS --
Line 50, change "t" to -- $t_7$ --

Column 9,
Line 13, change "NET 122" to -- NET122 --

Column 10,
Line 47, change "itself However," to -- itself. However, --
Line 58, change "$t_{15}$" to -- $t_{15}$. --
Line 66, change "$t^{hl}$" to -- $t_{hl}$ --

Column 11,
Line 3, change "(unskewed CMOS)" to -- unskewed CMOS --

Signed and Sealed this

Eighth Day of March, 2005

JON W. DUDAS
*Director of the United States Patent and Trademark Office*